United States Patent

Kashimura et al.

[11] Patent Number: 5,406,329
[45] Date of Patent: Apr. 11, 1995

[54] SOLID STATE IMAGE PICKUP APPARATUS HAVING TEST SIGNAL GENERATOR

[75] Inventors: Naoki Kashimura; Kazuhiro Kawamura, both of Tokyo, Japan

[73] Assignee: Ikegami Tsushinki Co., Ltd., Tokyo, Japan

[21] Appl. No.: 98,273

[22] PCT Filed: Jan. 7, 1993

[86] PCT No.: PCT/JP93/00007
§ 371 Date: Aug. 2, 1993
§ 102(e) Date: Aug. 2, 1993

[87] PCT Pub. No.: WO93/14602
PCT Pub. Date: Jul. 22, 1993

[30] Foreign Application Priority Data
Jan. 8, 1992 [JP] Japan .................. 4-001640

[51] Int. Cl.6 .............. H04N 17/00; H04N 5/335
[52] U.S. Cl. .................. 348/175; 348/187; 348/265; 348/537; 348/222
[58] Field of Search .......... 348/175, 181, 183, 187, 348/222, 265, 537, 539; H04N 17/00, 5/335; 358/41, 139, 10

[56] References Cited

U.S. PATENT DOCUMENTS

| | | | |
|---|---|---|---|
| 4,454,545 | 6/1984 | Duschl | 358/213 |
| 4,599,640 | 7/1986 | Dischert | 348/265 |
| 4,675,549 | 6/1987 | Steffe et al. | |
| 4,737,848 | 4/1988 | Kohno | 358/148 |
| 4,831,444 | 5/1989 | Kato | 358/160 |
| 4,873,574 | 10/1989 | Darby | 358/139 |
| 5,229,848 | 7/1993 | Sugasawa | 348/265 |

FOREIGN PATENT DOCUMENTS

| | | |
|---|---|---|
| 61-187470 | 8/1986 | Japan . |
| 62-107595 | 5/1987 | Japan . |
| 207011175 | 5/1990 | Japan . |

Primary Examiner—James J. Groody
Assistant Examiner—Sherrie Hsia
Attorney, Agent, or Firm—Spencer, Frank & Schneider

[57] ABSTRACT

A solid state image pickup apparatus includes a solid state image pickup device for receiving an optical image of an object and generating an electrical image signal representing the optical image of the object in synchronism with a driving pulse from a driving circuit. A sampling circuit generates a sampled image signal by sampling the electrical image signal read out of the solid state image pickup device with a first sampling pulse from a first pulse circuit synchronized with the driving pulse. An analog-to-digital convertor converts the sampled image signal to a digital image signal with a second sampling pulse from a second pulse circuit. A test signal generator generates a test signal which is synchronized with the driving pulse and alternately changes in level between consecutive pixels. A controller controls the phase of the first sampling pulse and the phase of the second sampling pulse relative to each other by processing the test signal.

27 Claims, 24 Drawing Sheets

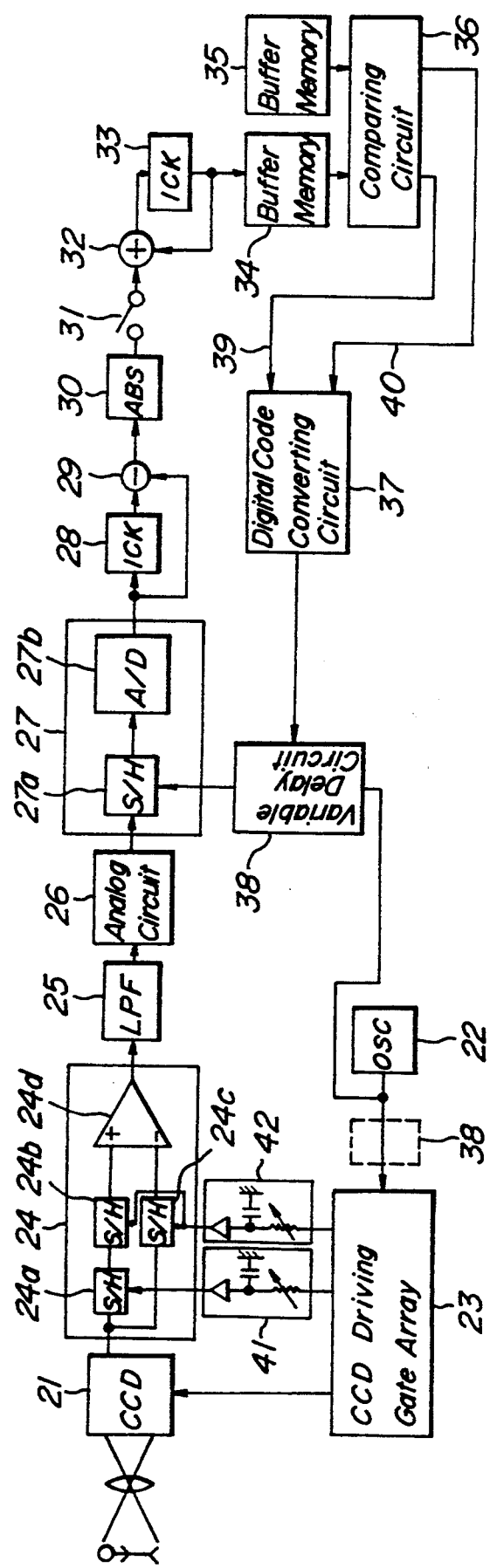

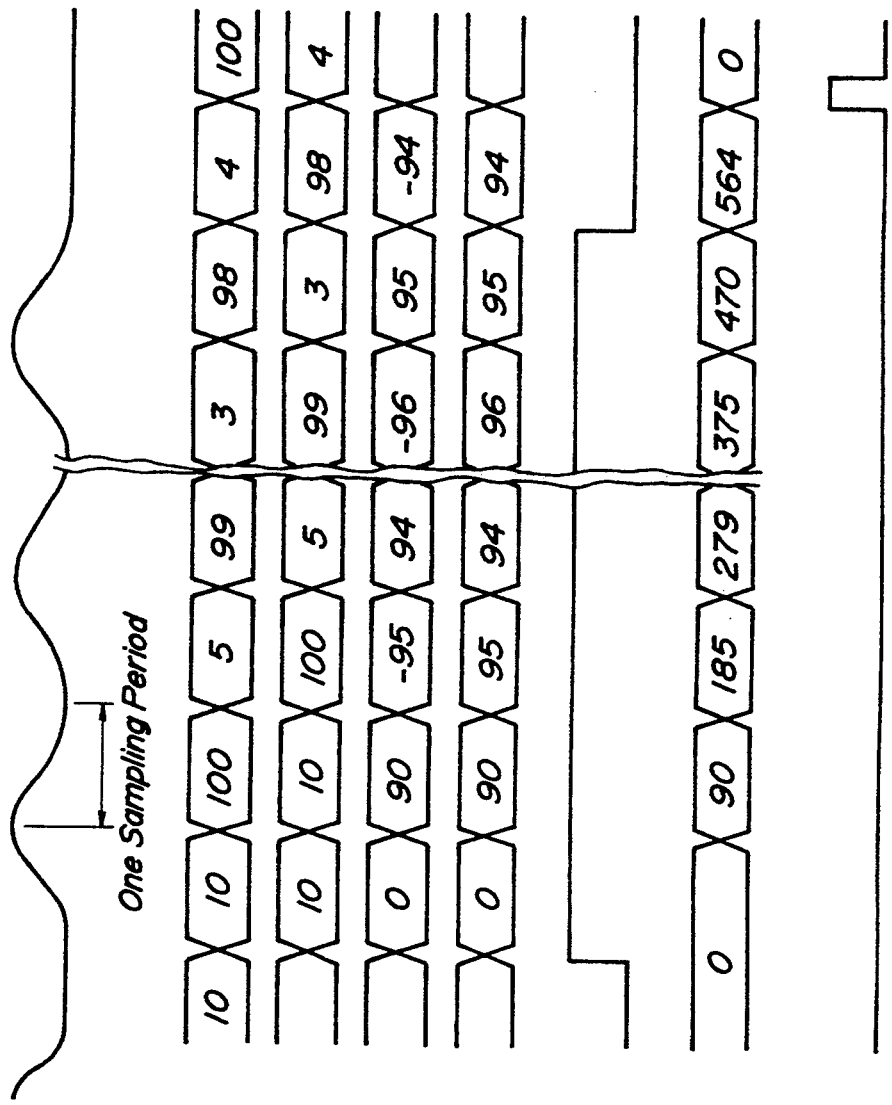

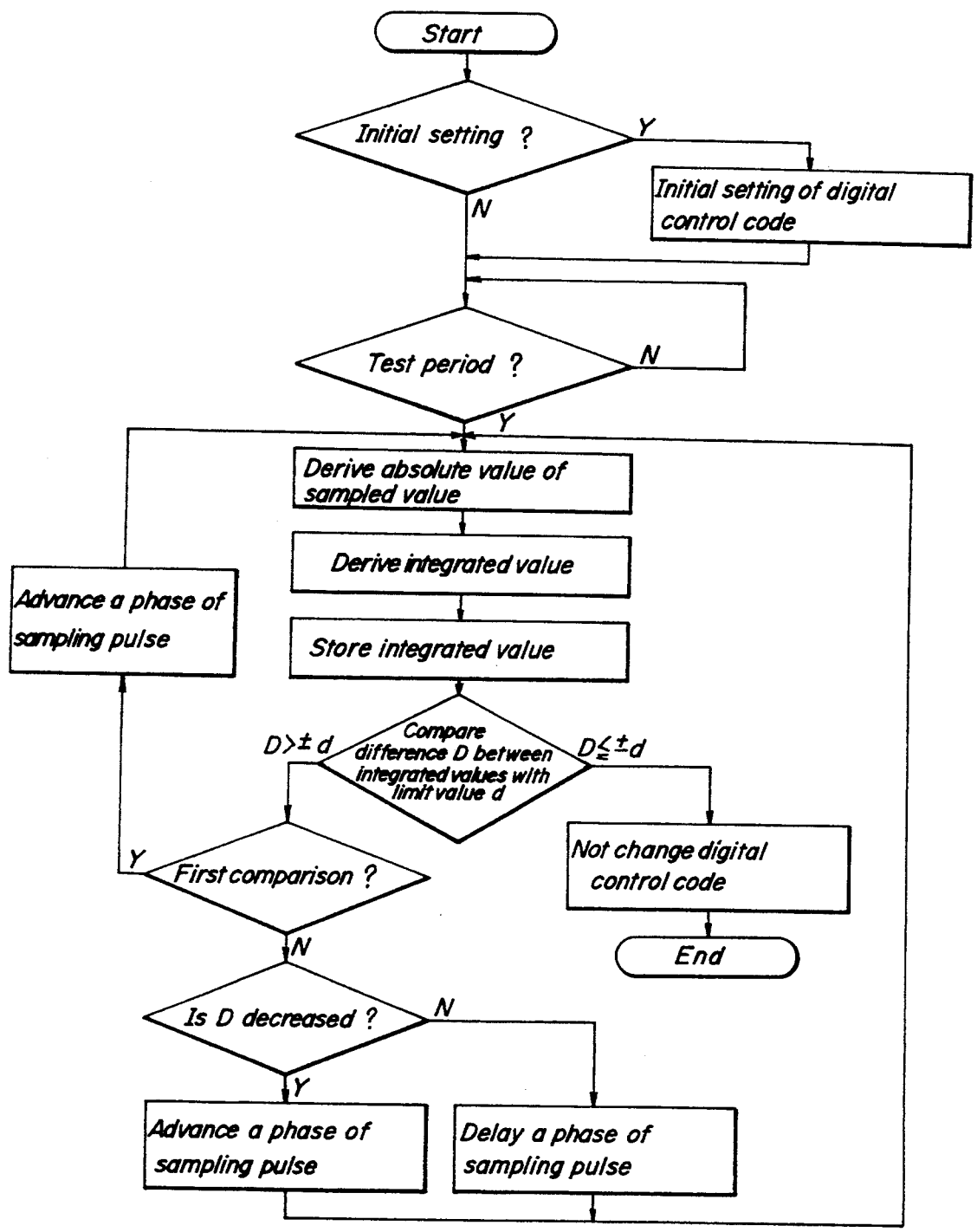
FIG_6

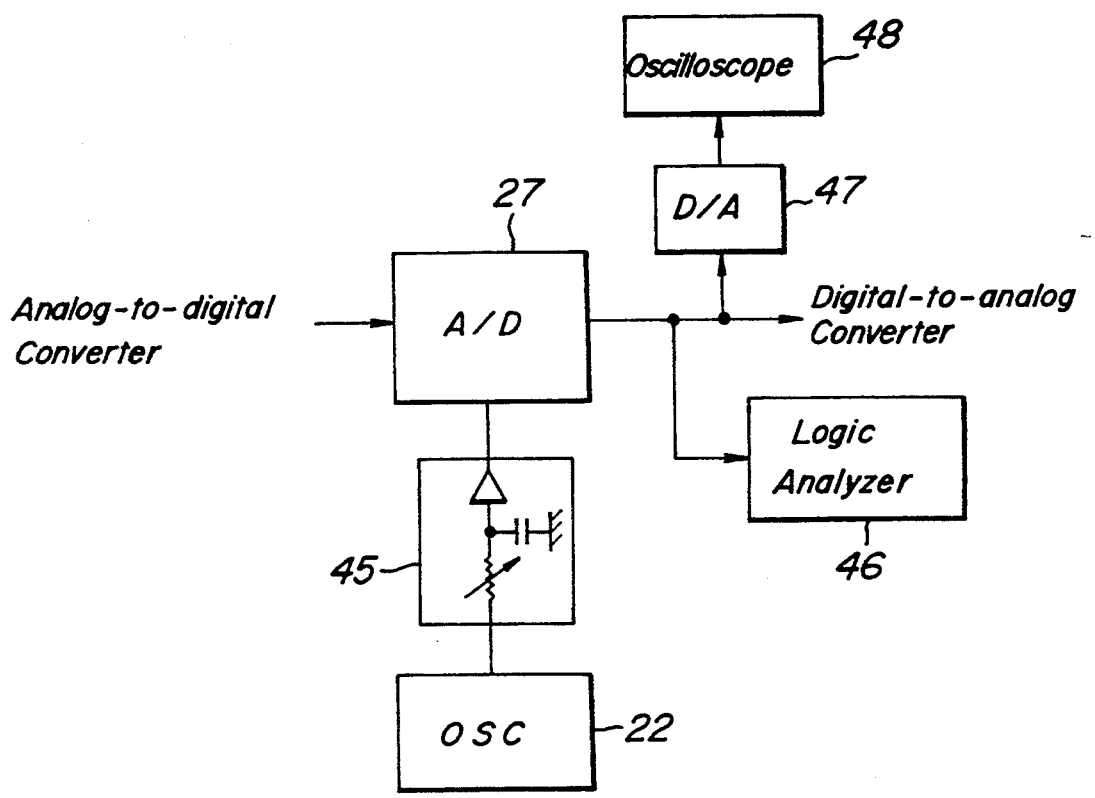
FIG_7

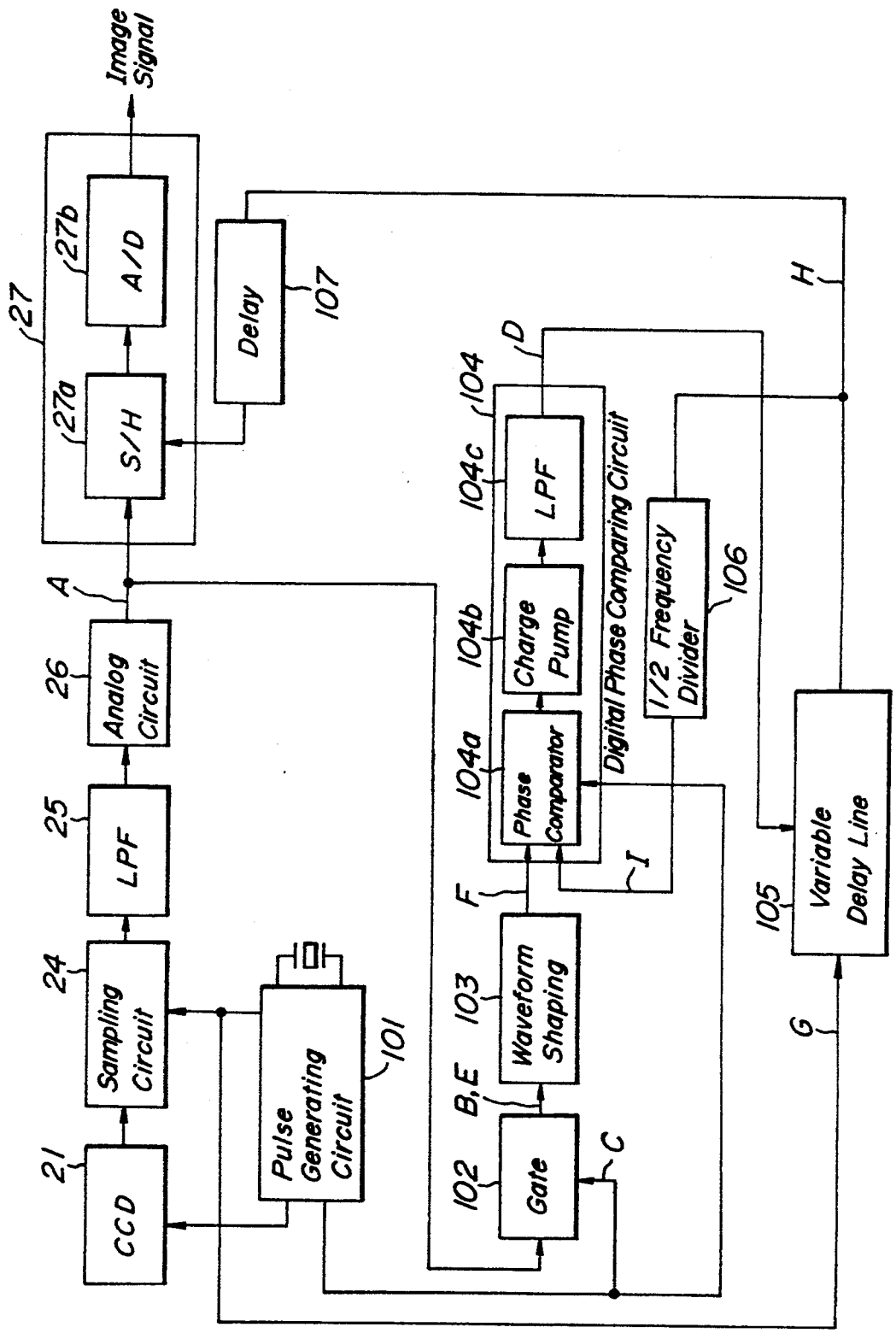

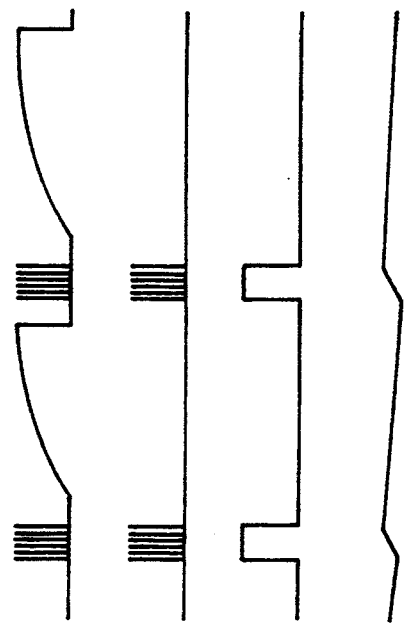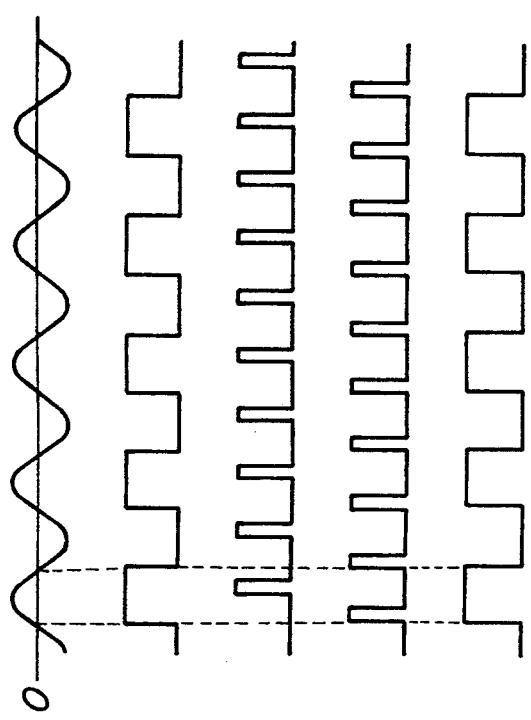
FIG.9A FIG.9B FIG.9C FIG.9D FIG.9E FIG.9F FIG.9G FIG.9H FIG.9I

FIG_11
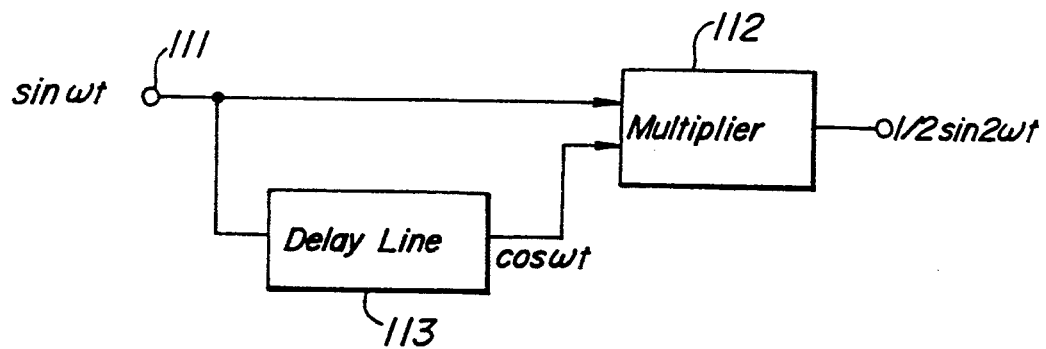
FIG_12
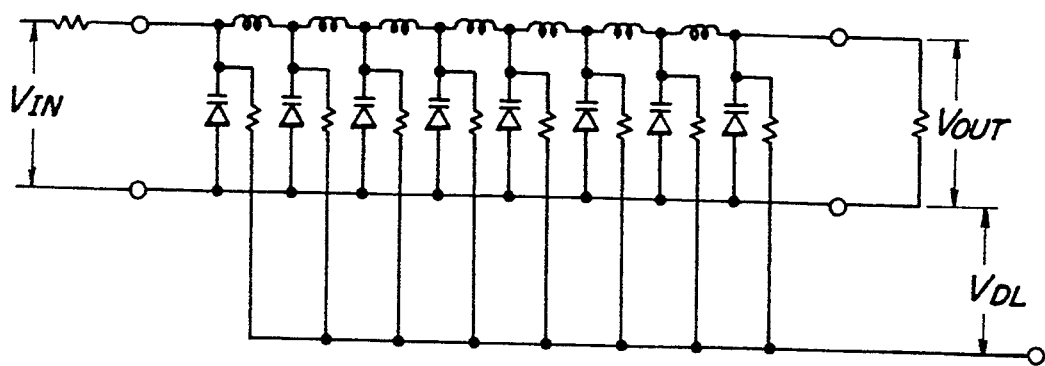

FIG_17A
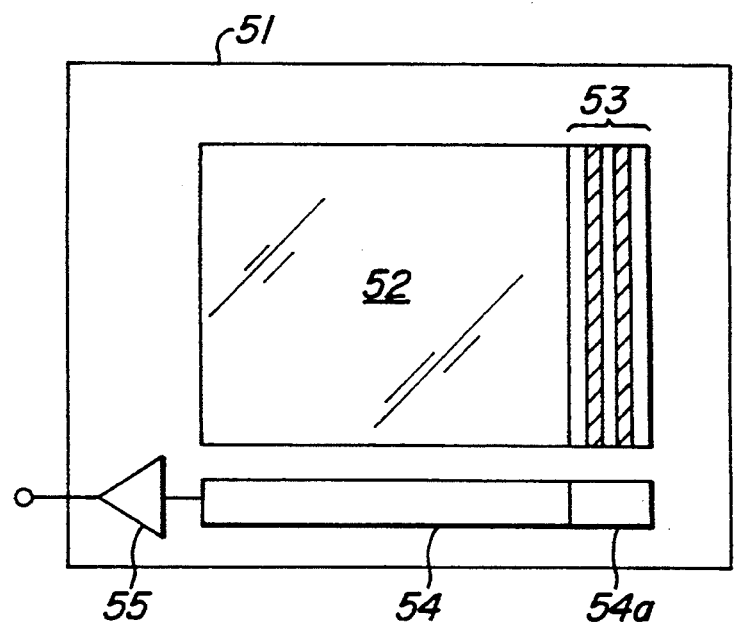
FIG_17B
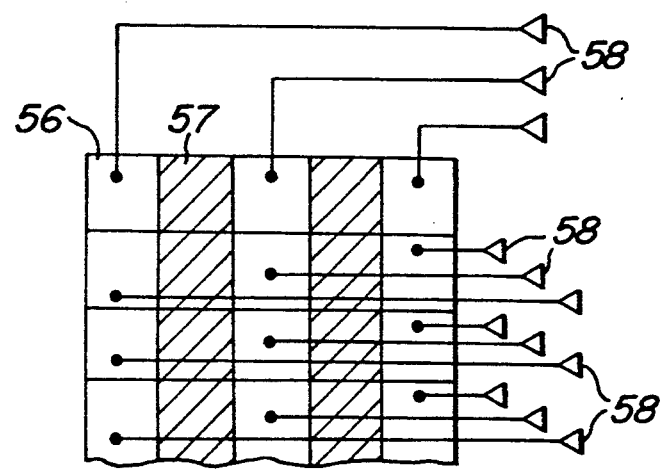

FIG_18
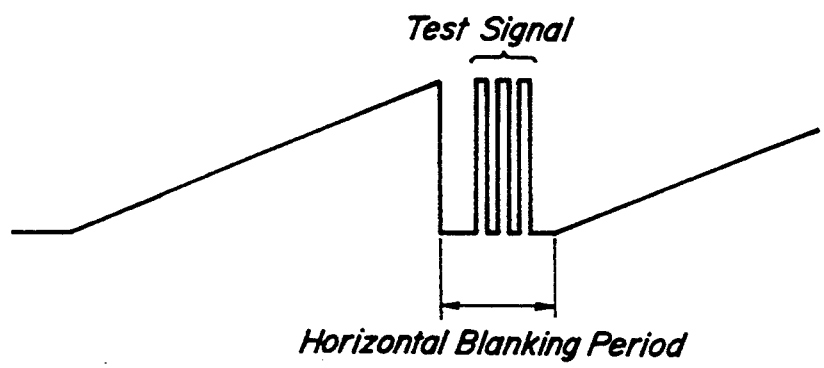
FIG_19
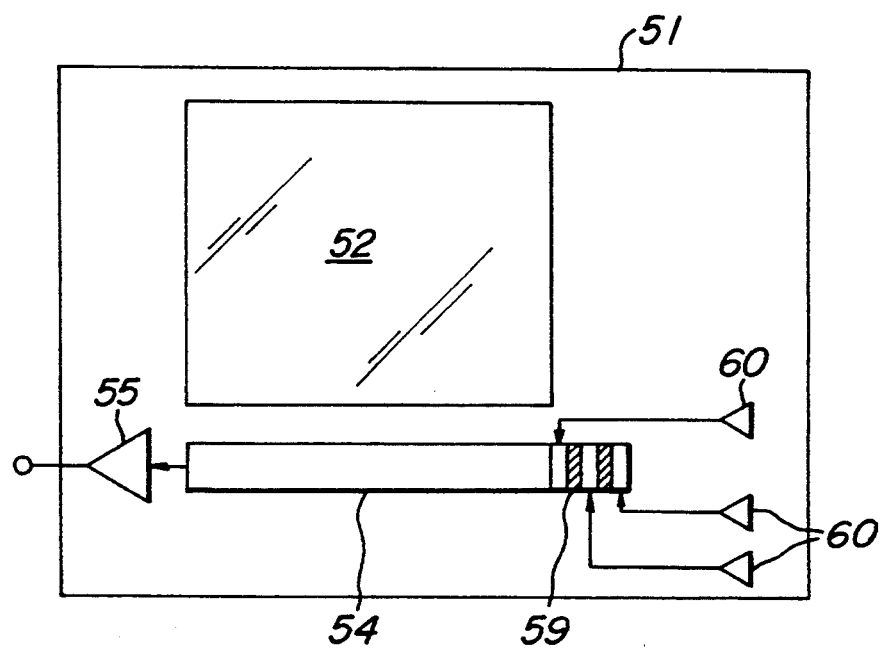

FIG_20
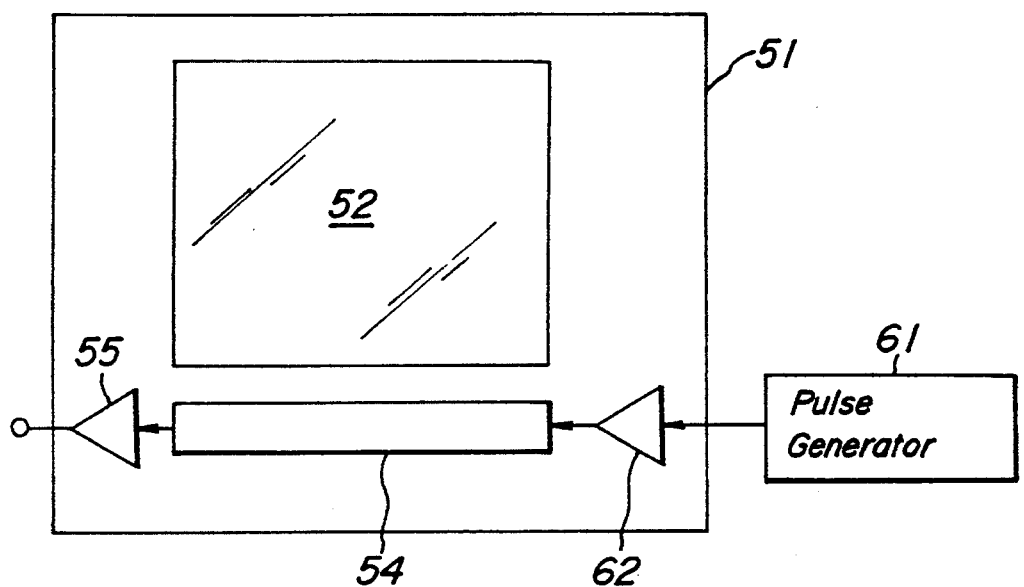
FIG_21
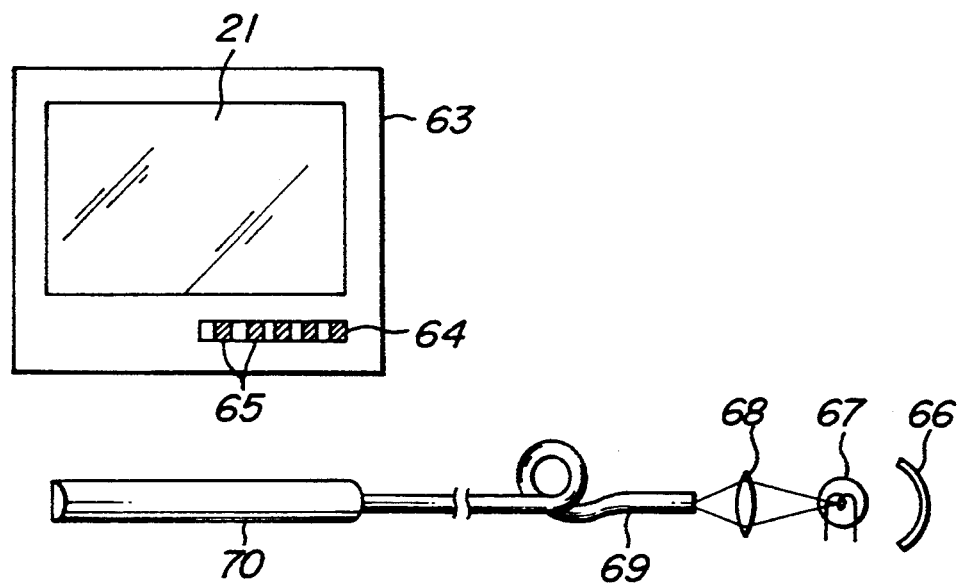

FIG_22
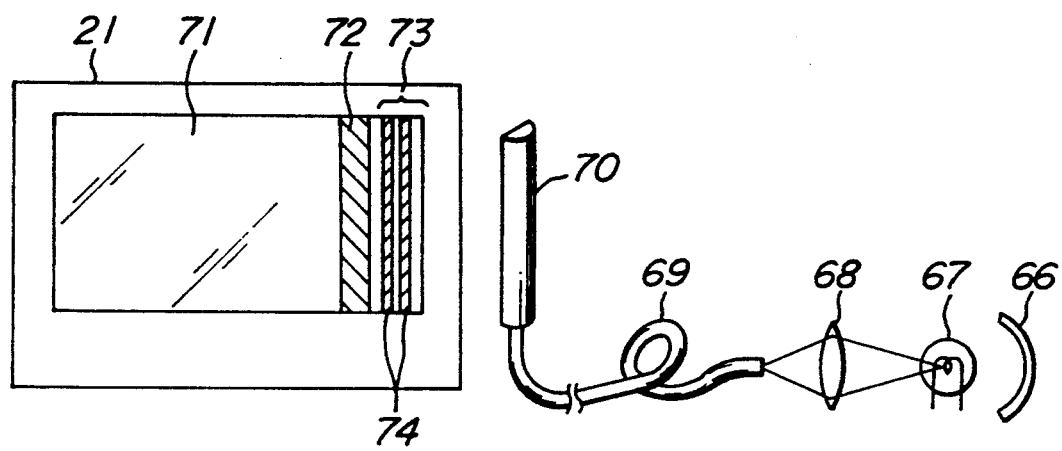

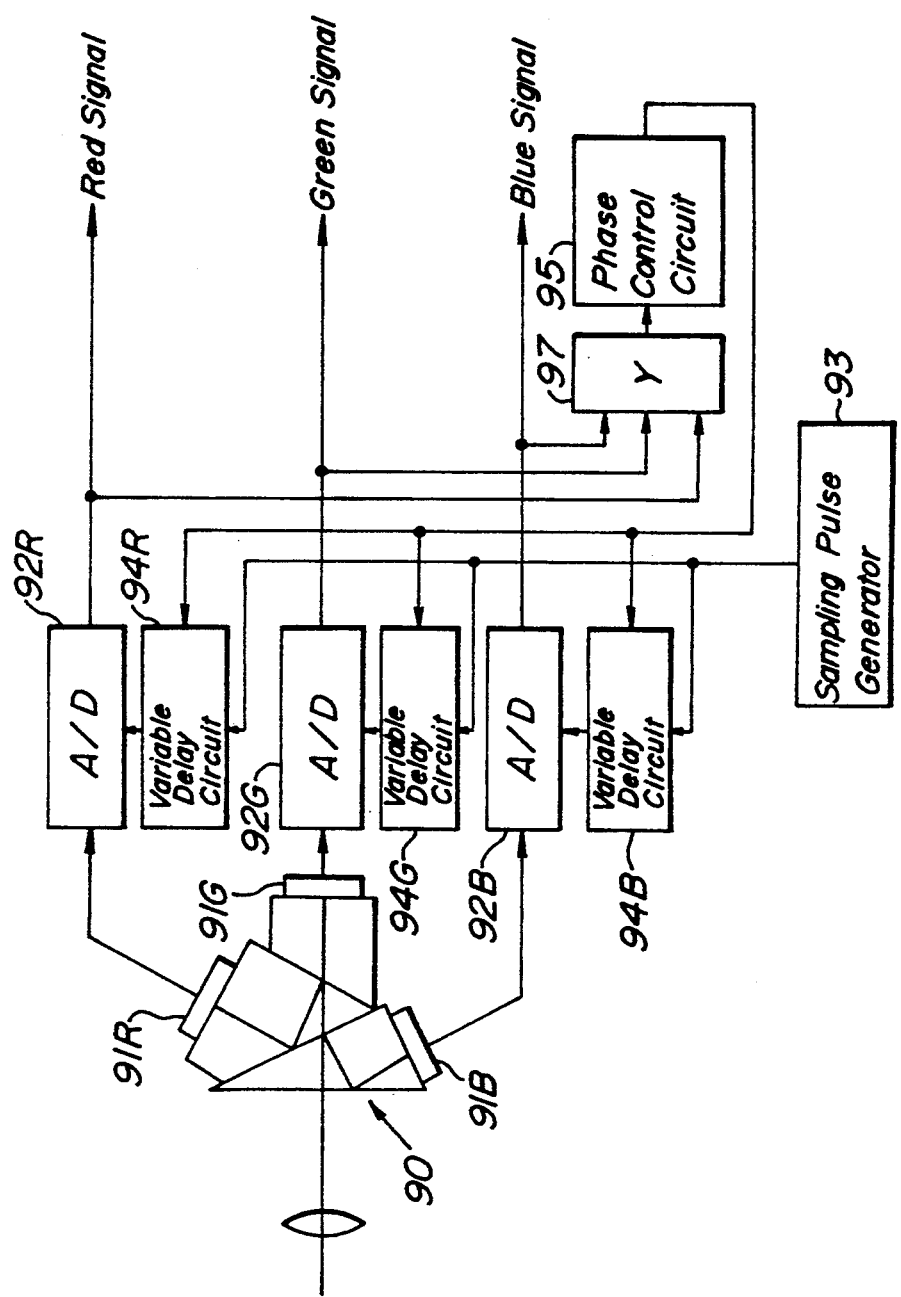

SOLID STATE IMAGE PICKUP APPARATUS HAVING TEST SIGNAL GENERATOR

FIELD OF THE INVENTION

The present invention relates to a solid state image pickup apparatus comprising a solid state image pickup device which receives an image of an object to be picked up and generates an image signal representing the image of the object in synchronism with a driving pulse, a driving means for generating the driving pulse to be supplied to the solid state image pickup device, a sampling means for generating a sampled image signal by sampling the image signal read from the solid state image pickup deice by means of a sampling pulse synchronized with said driving pulse, a means for generating the sampling pulse to be supplied to the sampling means, an analog-to-digital converting means for converting the sampled image signal to a digital image signal by means of a sampling pulse for analog-to-digital conversion, and a means for generating the sampling pulse for analog-to-digital conversion to be supplied to the analog-to-digital converting means, and the present invention also relates to a solid state image pickup device used in the above mentioned solid state image pickup apparatus.

DESCRIPTION OF THE BACKGROUND ART

Various television cameras using a solid state image pickup device as an device have been proposed, and television cameras using a charge-coupled device (CCD) as a solid sate image pickup device have been widely used. In a CCD camera, a signal read out of the CCD is sampled by a sampling circuit, for example a correlative double sampling circuit, is passed through analog signal processing circuits which perform a filtering process to remove clock noise, a gain control, a non-linear processing, and the like, and then is sampled and converted into a digital image signal by means of an analog-to-digital converter to take out a television image signal. The analog-to-digital converter samples and holds a digital image signal by means of a sample and hold circuit and converts the thus held signal to a digital signal. In the case where a flash type analog-to-digital converter is used and as the analog-to-digital converter, an input analog image signal is directly converted into a digital image signal, and the analog-to-digital conversion is performed in synchronism with the sampling pulse. In order to distinguish the sampling pulse used in the analog-to-digital converter from the sampling pulse used in the correlative double sampling circuit, in this specification the former sampling pulse is called a sampling pulse for analog-to-digital conversion.

A known solid state image pickup apparatus whose block diagram is shown in FIG. 1 reads a CCD 1 with a driving pulse from a CCD driving gate array 3 for generating a CCD driving signal in response to a reference clock signal generated by a reference oscillator (OSC) 2, samples the signal read from the CCD 1 by means of a correlative double sampling circuit 4, passes the signal through an analog signal processing circuit 6 performing a gain control, nonlinear processing and the like, after passing it through a low-pass filter 5 to remove clock noise, and then makes an analog-to-digital conversion in an analog-to-digital converting circuit 7 by means of a sampling pulse for analog-to-digital conversion to obtain a digital television image signal.

The correlative double sampling circuit 4 has three sample and hold circuits 4a, 4b and 4c driven by three sampling pulses whose phases are different from each other and which are generated by the CCD driving gate array 3, and derives by means of a differential amplifier 4d a difference in level between two sampled values taken by sampling the signal read from the CCD 1, namely, a sampled value (black sample, as shown in FIG. 2A) taken by sampling the signal from the CCD 1 at a black level sampling point B in a zero-signal period and a sampled value (white sample as shown in FIG. 2A) taken by sampling the signal from the CCD at a white level sampling point W in a signal period. Since the correlative double sampling circuit is set just behind the CCD 1 and processes the signal which has not passed through the analog signal processing circuit 6, the variation in phase between a sampling pulse and a signal read from the CCD 1 in this place is so slight and stable that it may not cause any problem.

The image signal obtained from the correlative double sampling circuit 4 is passed through the low-pass filter 5 and the analog signal processing circuit 6, and then is sampled by the analog-to-digital converting circuit 7. The analog-to-digital converting circuit 7 of this example is not a flash type circuit, but an ordinary type circuit having a sample and hold circuit 7a and an analog-to-digital converter 7b. The sampling pulse for analog-to-digital conversion for determining a sampling timing in the sample and hold circuit 7a of the analog-to-digital converting circuit 7 is generated by the reference oscillator 2. In this manner, the timing of reading the signal from the CCD 1 and a timing of sampling in the analog-to-digital converting circuit 7 are coincident with each other.

In the above mentioned solid state image pickup apparatus having CCD 1, when a phase of the sampling pulse for analog-to-digital conversion in the analog-to-digital converting circuit 7 is correct relative to a phase of the sampling pulse in the correlative double sampling circuit 4, a signal as shown in FIG. 2B is entered into the low-pass filter 5 and a signal as shown in FIG. 2c is read out from the low-pass filter 5 upon picking up an image of a black and white stripe pattern having a maximum spatial frequency in a manner shown in FIG. 3. The signal is sampled at an ideal level as shown in FIG. 2E if being sampled by a sampling pulse for analog-to-digital conversion having an ideal phase as shown in FIG. 2D. In this manner, an analog image signal which has been read from the CCD 1 and sampled in the correlative double sampling circuit 4 is converted into a digital image signal having a desired maximum spatial frequency. However, if the phase of the sampling pulse for analog-to-digital conversion deviates from the ideal phase as shown in FIG. 2F, sampling at an ideal level cannot be performed in the analog-to-digital converting circuit 7 and as a result the original black and white stripe pattern cannot be reproduced as shown in FIG. 2G. In order to set the sampling timing as a desired timing, a pulse phase adjuster 8 is provided for adjusting a phase of the sampling pulse for analog-to-digital conversion to be supplied from the reference oscillator 2 to the sample and hold circuit 7a of the analog-to-digital converting circuit 7. And pulse phase adjusters 9 and 10 are also provided so as to adjust phases of sampling pulses to be supplied to the correlative double sampling circuit 4. Each of the pulse phase adjusters 8 to 10 is a circuit for manually adjusting a pulse phase and is composed of a variable resistor, capacitor and buffer ampli- -fier, but the pulse phase can be also adjusted by means of other methods than this.

In the known solid state image pickup apparatus shown in FIG. 1, the analog image signal is converted into the digital image signal by means of the ordinary analog-to-digital converting circuit 7 having the sample and hold circuit 7a and analog-to-digital converter 7b, but the conversion may be equally carried out by means of a flash type analog-to-digital converting circuit having no sample and hold circuit instead of such an analog-to-digital converting circuit. In this case, the sampling pulse for analog-to-digital conversion may be supplied to the analog-to-digital converter 7b as shown by a chain line in FIG. 1.

As described above, the pulse phase adjusters 9 and 10 are provided for adjusting a timing for sampling the signal read from the CCD 1 in the correlative double sampling circuit 4 and the phase adjuster 8 is provided for adjusting a phase of the sampling pulse for analog-to-digital conversion in the analog-to-digital converting circuit 7. In the initial setting, the pulse phases are adjusted by means of these pulse phase adjusters so as to obtain the optional phase relation. However, since there is the possibility that the phase relation between the sampling pulses will deviate from an ideal one while the solid state image pickup apparatus is used, it is necessary to readjust the phase relation. The reasons are that a time lag from a point in time of receiving a clock signal from the reference oscillator 2 to a point in time of generating a CCD driving pulse varies from about 10 to 20 ns for respective devices and changes of temperature since the CCD driving gate array 3 is of MOS structure, that a time lag from a point in time of receiving a sampling pulse to a point of time of making an actual sampling operation in the flash type analog-to-digital converting circuit 7 varies also about ten and several ns, and that a phase relation between a signal to be supplied to the analog-to-digital converting circuit 7 and a sampling pulse is affected by a time lag caused by the low-pass filter 5 and analog signal processing circuit 6 which give a time lag to a signal, since the flash type analog-to-digital converting circuit 7 is provided behind the low-pass filter 5 and analog signal processing circuit 6.

Therefore, there is the disadvantage that a desired image signal could not be obtained as a result of the optional timing of sampling a shown in FIGS. 2C and 2D is lost after the initial setting. As described above, since a phase deviation in the correlative double sampling circuit 4 is not so great, it is not always necessary to readjust the pulse phase adjusters 9 and 10, but since a time lag in the low-pass filter 5 and analog signal processing circuit 6 considerably varies with aging and temperature change, the phase adjuster 8 controlling a phase of the sampling pulse for analog-to-digital conversion to be supplied to the analog-to-digital converting circuit 7 needs to be readjusted even when it is in use.

A respective one of said deviations is small, but a total deviation is not negligible in a system for sampling the signal in a high frequency band. In a system for processing a television signal of the NTSC system of the existing color television system adopted in Japan, the sampling period is 70 ns, but there is the possibility that the sampling period will be set as 50 ns or less in the near future and then even a deviation of about 10 ns becomes unacceptable. Furthermore, in the Hi Definition Television System, where the sampling period is 14 ns, even only a very small deviation of about 1 to 2 ns is not negligible.

As described above, in the known solid state image pickup apparatus, it is necessary to readjust the sampling timing while it is in use as well as to adjust the sampling timing in the initial setting. Up to now, in case of making such adjustment, as shown in FIG. 3, a test chart 14 having a black and white stripe pattern to give the highest frequency in the horizontal scanning direction is placed in front of a solid state image pickup apparatus 13 mounted on a tripod 12. The chart is uniformly illuminated by an illuminating apparatus 15, the tripod is fixed so as to correctly direct the solid state image pickup apparatus toward the test chart in the horizontal and vertical directions, and a fine adjustment is made so that the stripe pattern cycle may become ideal to alignment of the image pickup device of the solid state image pickup apparatus. Then the pulse phase adjusters 8 and 9 shown in FIG. 1 are finely adjusted while observing an image signal obtained by the analog-to-digital conversion by means of a logic analyzer or observing it by means of an oscilloscope after converting it from a digital signal to an analog one. Such an adjusting method has a disadvantage that not only is it very troublesome and requiring of skilled but also it takes a long time to set the test chart 14 and the image pickup device of the solid state image pickup apparatus in a specified relation. Another disadvantage is that the highest-frequency image signal cannot be obtained since the sampling timing might be deviated from the ideal point if the adjustment is not exactly made. And this adjusting method also has the disadvantage that it needs the tripod 12, test chart 14 and illuminating apparatus 15 and the like and there is the possibility that readjustment cannot be performed because they cannot be set up.

OBJECT OF THE INVENTION

An object of the invention is to remove the above-mentioned former disadvantages, namely, to provide a solid state image pickup apparatus and a solid state image pickup device used in such a solid state image pickup apparatus, in which a phase of a sampling pulse for analog-to-digital conversion can be adjusted in relation to a timing of reading from the solid state image pickup device in a short time without a tripod, test chart, illuminating apparatus and the like and accordingly without requiring skill.

SUMMARY OF THE INVENTION

The invention provides a solid state image pickup apparatus comprising a solid state image pickup device for receiving an image of an object to be picked up and generating an image signal representing the image of the object, a driving means for generating a driving signal to be supplied to the solid state image pickup device, a sampling means for generating a sample image signal sampled by a first sampling pulse synchronized with the driving pulse, a means for generating the first sampling pulse to be supplied to the sampling means, an analog-to-digital converting means for converting the sampled image signal to a digital image signal by means of a second sampling pulse for analog-to-digital conversion, a means for generating the second sampling pulse for analog-to-digital conversion to be supplied to the analog-to-digital converting means, a test signal generating means for generating a test signal alternately changing in level between at least two successive pixels synchronously with the first sampling pulse, and a means for adjusting the first phase of a sampling pulse on the basis of a signal obtained by sampling the test signal.

In the above mentioned solid state image pickup apparatus according to the invention, it is possible to obtain a very accurate test signal without picking up an image of a test chart as used up to now and accordingly it is possible to easily and exactly adjust a sampling timing through generating the test signal alternately changing in level between at least two consecutive pixels in synchronism with the driving pulse to read the pixels inside the solid state image pickup apparatus.

In a solid state image pickup device according to the invention, an image pickup part for receiving an image of an object to be picked up and generating electrostatic charges corresponding to the image, a transfer part for transferring said electrostatic charges generated in the image pickup part to derive an image signal, and a test signal generating part for generating a test signal alternately changing in level for each pixel synchronously with the image signal, said test signal being used for adjusting the sampling timing of the image signal, are integrally formed in a single semiconductor chip or in a single package, and said image pickup part, transfer part and test signal generating part are read by means of a common driving pulse.

Such a solid state image pickup device according to the invention simplifies construction since it can generate the test signal by itself, while it can always obtain the test signal synchronized with the image signal and can exactly adjust the sampling timing since it generates the test signal by means of the common driving pulse for reading the image signal from the image pickup part.

In a preferred embodiment of the solid state image pickup apparatus according to the invention, absolute values of the difference between the consecutive digital test signals are sampled by a sampling means and converted by an analog-to-digital converting means, and a phase of a sampling pulse is controlled such that an accumulated value of the absolute values becomes maximum.

In another preferred embodiment of a solid state image pickup apparatus according to the invention, a phase of the analog test signal to be inputted into an analog-to-digital means is compared with a phase of the second sampling pulse for analog-to-digital conversion, and the phase of the second sampling pulse for analog-to-digital conversion is controlled on the basis of said comparison.

Furthermore, in applications of the solid state image pickup apparatus according to the invention in which a plurality of the solid state image pickup devices are provided, it possible to easily adjust phases of output image signals of these sold state image pickup devices as well as to easily adjust the phase of the output signal of the correlative double sampling circuit with respect to the sampling timing or clock signal.

For example in U.S. Pat. No. 4,675,549, it is disclosed that cells for generating a black-level image signal and cells for generating a white-level image signal are integrally formed in a single semiconductor chip on which a CCD is formed and these cells are read out at the same time when reading the ordinary image signal. However, in this known solid state image pickup device, these black-level and white-level cells are not read out alternately and the black-level and white-level image signals are merely used as reference levels, therefore these signals could not be used for adjusting the phase of the sampling pulse contrary to the present invention.

BRIEF DESCRIPTION OF THE DRAWINGS

FIG. 4 is a block diagram showing the construction of an embodiment of the solid state image pickup apparatus according to the invention.

FIGS. 5A to 5H are signal waveform diagrams for explaining the operation of the apparatus of FIG. 4.

FIG. 6 is a flowchart representing the operation of another embodiment of the solid state image pickup apparatus according to the invention.

FIG. 7 is a block diagram illustrating the construction of another embodiment of the solid state image pickup apparatus according to the invention.

FIG. 8 is a block diagram depicting the construction of another embodiment of the solid state image pickup apparatus according to the invention.

FIGS. 9A to 9I are signal waveform diagrams for explaining the operation of the apparatus shown in FIG. 8.

FIG. 11 is a block diagram depicting the construction of an embodiment of a frequency multiplier shown in FIG. 10.

FIG. 12 is a circuit diagram illustrating the construction of an embodiment of an analog type variable delay line shown in FIGS. 8 and 10.

FIG. 17A and 17B are schematic views showing the construction of an embodiment of the solid state image pickup device according to the invention.

FIG. 18 is a waveform diagram representing the test signal according to the invention.

FIG. 19 is a schematic view illustrating the construction of another embodiment of the solid state image pickup device according to the invention.

FIG. 20 is a schematic view showing the construction of another embodiment of the solid state image pickup device according to the invention.

FIG. 21 is a schematic view depicting the construction of another embodiment of the solid state image pickup device according to the invention.

FIG. 22 is a schematic view showing the construction of still another embodiment of the solid state image pickup device according to the invention.

FIG. 27 is a schematic view illustrating the construction of still another embodiment of the color television camera using the solid state image pickup devices according to the invention.

DETAILED DESCRIPTION OF THE PREFERRED EMBODIMENTS

Figure 1:
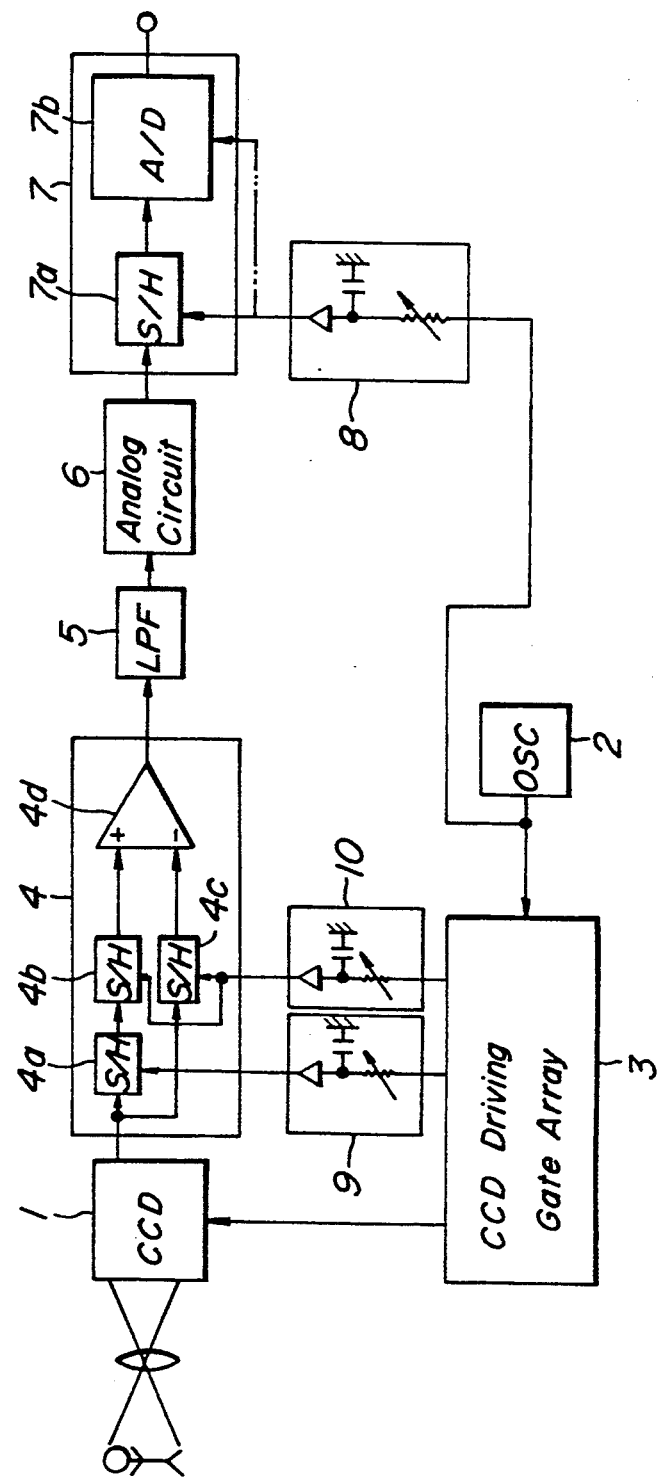
FIG. 1 is a block diagram showing the construction of a known solid state image pickup apparatus.
Figure 2:
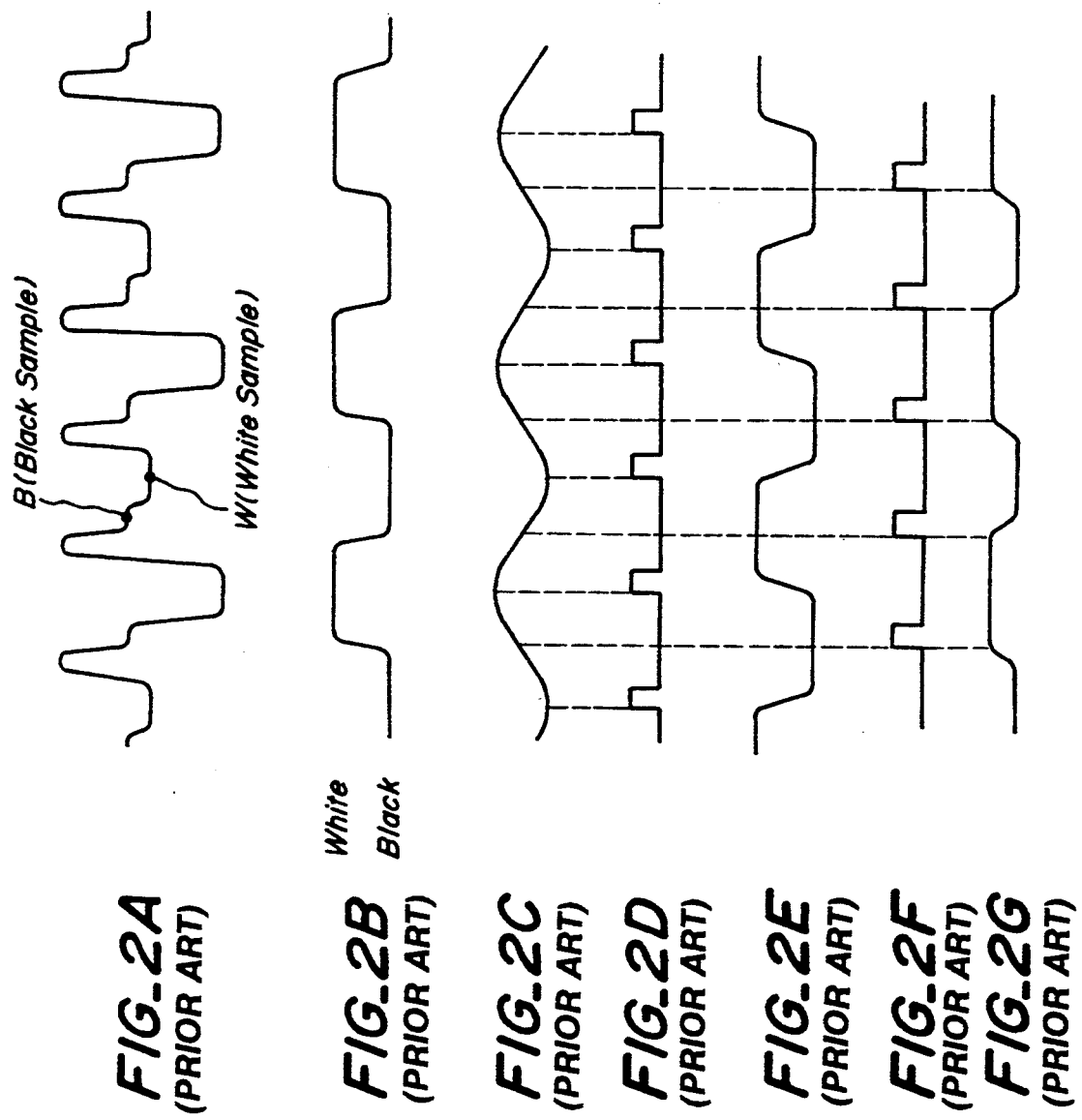
FIGS. 2A to 2G are signal waveform diagrams for explaining the operation of the known solid state image pickup apparatus.
Figure 3:
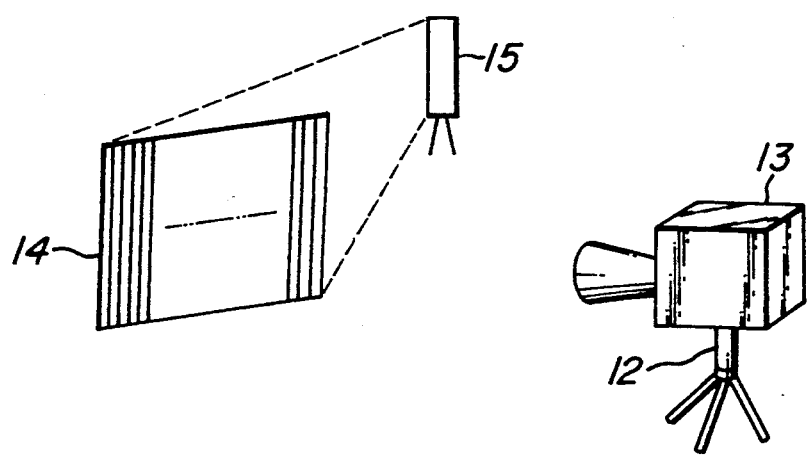
FIG. 3 is a schematic view of a system for adjusting a sampling timing in the known apparatus.

The invention will be described in detail with reference to the attached drawings.

FIG. 4 is a block diagram showing the construction of an embodiment of the solid state image pickup apparatus according to the invention. In the present embodiment, use is made of a CCD 21 as the solid state image pickup device, a test signal is generated during a horizontal blanking period of an image signal read out of the CCD, and a sampling timing is automatically adjusted on the basis of the test signal. A detailed construction of the CCD from which the test signal can be read will be explained later. There is provided a reference oscillator 22 for generating a reference clock signal which is supplied to a CCD driving gate array 23 for generating a driving pulse for reading an image signal from the CCD and two sampling pulses for a correlative double sampling circuit 24. The correlative double sampling circuit 24 is equipped with three sample and hold circuits 24a, 24b and 24c and a differential amplifier 24d, and is the same in construction as the known circuit. An output signal of the correlative double sampling circuit 24 is supplied to an analog-to-digital converting circuit 27 through a low-pass filter 25 and an analog signal processing circuit 26. The analog-to-digital converting circuit 26 is an ordinary one having a sample and hold circuit 27a and an analog-to-digital converter 27b.

In the present embodiment, the analog-to-digital converting circuit 27 has a built-in sample and hold circuit 27a, but according to the invention use may be made of an analog-to-digital converting circuit having no built-in sample and hold circuit. In such a case, a sample and hold circuit may be arranged before the analog-to-digital converting circuit and a sampling pulse for analog-to-digital conversion whose phase has been adjusted may be supplied to the sample and hold circuit.

In case of using a high-performance flash type analog-to-digital converting circuit, the sample and hold circuit 27a is unnecessary, but it is necessary to supply a sampling pulse for analog-to-digital conversion to the analog-to-digital converter. In the present embodiment, in order to sample the output signal of the CCD, the correlative double sampling circuit 24 is used, but it may be replaced by any other circuit or such a sampling circuit may be dispensed with.

FIG. 4 shows an embodiment of the solid state image pickup apparatus according to the invention, but the above-mentioned correlative double sampling circuit and/or analog circuit are not always necessary for performing the present invention.

In the present embodiment, the test signal included in the output signal of the analog-to-digital converting circuit 27 is taken out after making a desired processing of the signal read out of the CCD 21 and a phase of a sampling pulse to be supplied to the analog-to-digital converting circuit 27 is automatically and optimally adjusted to obtain a desired digitized test signal. The test signal read from the CCD 21 is sufficient to attain alternately the black level and white level in at least two consecutive cycles. In the present embodiment, the test signal reveals alternately the black and white levels over ten cycles in a horizontal blanking period and peak-to-peak values of these black and white levels are detected. To this end, the output signal of the analog-to-digital converting circuit 27 is passed through a delay circuit 28 having a delay time of one clock period, a difference between a delayed signal and a non-delayed signal is derived by means of a subtracting circuit 29, and an absolute value of the difference is obtained by an absolute value circuit 30. A peak-to-peak value of the thus obtained absolute value of the difference becomes maximum when the test signal is sampled with the optimum phase but is decreased when the sampling timing is deviated from the optimum phase.

The output signal of the absolute valve circuit 30 is supplied to one input terminal of an adding circuit 32 through a switch 31 which is turned on only in a period during which the test signal is generated, an output signal of the adding circuit 32 is supplied to a delay circuit 33 having a delay time of one clock period, and an output signal of the delay circuit 33 is supplied to the other input terminal of the adding circuit 32. The adding circuit 32 and delay circuit 33 comprise an integrating circuit to integrate the absolute values namely peak-to-peak values of test signals supplied from the absolute value circuit 30 during the turned-on period of the switch 31. In this manner, an integrated value of the absolute values of the peak-to-peak values of the test signals read out of the CCD 21 in the horizontal blanking period is stored in a first buffer memory 34. The integrated value stored in the first buffer memory 34 is transferred to a second buffer memory 35 and is stored therein. The integrated value stored in the first buffer memory 34 is compared with the integrated value stored in the second buffer memory 35, namely the integrated value of the absolute values of the peak-to-peak values of the test signals detected in a preceding horizontal blanking period, in a comparing circuit 36, a digital code signal outputted from the comparing circuit is supplied to a digital code converting circuit 37, an output signal of the digital code converting circuit 37 is then supplied to a digital variable delay circuit 38 inserted in a signal path for transmitting a sampling pulse from the reference oscillator 22 to the analog-to-digital converting circuit 27, and a phase of the sampling pulse for analog-to-digital conversion is adjusted in accordance with the digital code.

The comparing circuit 36 is constructed such that it produces a digital code onto the line 39 when the integrated value in the first buffer memory 34 is greater than the integrated value in the second buffer memory 35 and produces a digital code onto the line 40 when the former is smaller than the latter. When the digital code is derived onto the line 39, the digital variable delay circuit 38 receives the control code for advancing a phase of the sampling pulse for analog-to-digital conversion from the digital code converting circuit 37, and when the digital code is supplied onto the line 40, the digital variable delay circuit 38 receives the control code for delaying a phase of the sampling pulse for analog-to-digital conversion. Therefore, for example, when an integrated value stored in the first buffer memory 34 is greater than an integrated value stored in the second buffer memory 35 under a condition in which a phase of the sampling pulse for analog-to-digital conversion is advanced, the digital code is still supplied onto the line 39 and the phase of the sampling pulse for analog-to-digital conversion is further advanced. In this manner, a phase of the sampling pulse for analog-to-digital conversion is gradually shifted toward the optimum value. After a phase of the sampling pulse for analog-to-digital conversion has arrived at the optimum value, an integrated value in the first buffer memory 34 becomes smaller than an integrated value in the second buffer memory 35, and therefore the comparing circuit 36 supplies the control code onto the line 40 and accordingly a phase of the sampling pulse for analog-to-digital conversion is delayed. In this case, hunting appears around the optimum value. If such hunting is undesirable, the comparing circuit 36 may be constructed to derive a stopping control code when the deviation of a phase of the sampling pulse becomes within a value under some degree around the optimum value. In the present embodiment, the accuracy of comparison between test signal levels is improved by effecting the integration, but the same improvement may be performed by any other method.

The digital variable delay circuit 38 can be composed of a digital delay line whose phase shift is, for example, about 1 ns per step, namely, which can be adjusted in 70 steps in total, but if a finer adjustment is required, it can be also composed of a digital variable delay line whose phase shift is about 5 pico seconds per step and which can be adjusted in 2000 steps in total. In general, it can be composed of a digital variable delay line which can adjust the phase in a step of several tenths to one hundredth of one clock period (about 70 nsec in the NTSC system and 14 nsec in the hi-vision system) over at least about one clock period.

Now the operation for adjusting a phase of the sampling pulse for analog-to-digital conversion to the optimum value will be explained with reference to signal waveform diagrams shown in FIGS. 5A–5H.

FIG. 5A shows an input signal of the analog-to-digital converting circuit 27, FIG. 5B an output signal of the analog-to-digital converting circuit 27, FIG. 5C a signal delayed by one clock period through the delay circuit 28, FIG. 5D an output signal of the subtracting circuit 29, FIG. 5E an output signal of the absolute value circuit 30, and FIG. 5F shows a driving signal of the switch 31 which is in a high logic level (the switch is on) only in a period of processing test signals read out of the CCD in the horizontal blanking period and is in a low logic level (the switch is off) in the remaining period. FIG. 5G represents an integrated value of output of the one-clock-period delay circuit 33, and FIG. 5H shows a rewriting pulse for storing the integrated value in the first buffer memory 34, which pulse also clears the adding circuit 32. In this manner, an integrated value of peak-to-peak values of the test signals read out in the horizontal blanking period is derived and is stored in the first buffer memory 34 in response to the rewriting pulse (in FIG. 5H).

In this manner in the embodiment, a phase of the sampling pulse for analog-to-digital conversion to be supplied to the analog-to-digital converting circuit 27 is automatically adjusted so as to always maximize an integrated value of test signals, and therefore a digital image signal can always be obtained by sampling a signal read from the CCD with the optimum phase even if a phase of a driving pulse of the CCD 21 is deviated or a delay time in the low-pass filter 25 and analog circuit 26 is varied. In the embodiment shown in FIG. 4, a phase of the sampling pulse for analog-to-digital conversion to be supplied to the analog-to-digital converting circuit 27 is adjusted, but a phase of the sampling pulse to be supplied to the correlative double sampling circuit 24 is not adjusted. This is due to the fact that an input signal to the correlative double sampling circuit 24 does not pass through the low-pass filter 25 and analog circuit 26 having a factor of variation in a delay time and accordingly its time variation is a little. However, if time variation of an input to the correlative double sampling circuit 24 cannot be neglected, a phase of the sampling pulse therefore may also be adjusted by phase adjusters 41 and 42.

In the embodiment explained above, the automatic phase adjustment of the sampling pulse for analog-to-digital conversion is performed by hardware, but according to the invention, it may be carried out by software. Namely, the circuitry including the delay circuit 28 to the output side of the digital code converting circuit 37 may be replaced by a computer. FIG. 6 shows an example of flowcharts in case of controlling a phase of the sampling pulse for analog-to-digital conversion by processing the test signals by means of the computer.

After start, the system of the embodiment determines whether or not the initial setting is made. In making the initial setting, first a control code is set such that the digital code converting circuit 37 may output the control code to make a delay time of the digital variable delay circuit 38 come to about half the maximum delay time. As the initial setting value, the last set value also may be used as it is instead of setting such an initial value. When the initial setting is finished, next, it is determined whether or not the process is in a test period during which the test signal is read out of the CCD 21. If it is determined that the process is in the test period, the system takes the absolute values of differences in level between output signals of the analog-to-digital converting circuit 27 in consecutive clock pulse periods and integrates them one after another. When the test period is ended, the system stores the integrated value as the first integrated value S1. In the next test period also, the system takes the integrated value S2 in the same manner and compares it with the first integrated value. As a result of this comparison, the system determines whether or not the difference D is within a predetermined range ±d and if it is within the predetermined range, the system keeps supplying a digital code to the digital variable delay circuit 38 without changing it. Namely, in this case, the phase does not need to be adjusted, because a phase of the sampling pulse for analog-to-digital conversion is at the optimum value or very close to the optimum value.

On the other hand, if the difference D is beyond the predetermined range, the system determines whether or not the comparison is the first comparison after the initial setting and if it is the first one the system shifts a phase of the sampling pulse for analog-to-digital conversion. The shifting direction can be freely determined. It is assumed that a phase of the sampling pulse for analog to digital conversion is advanced. Namely, if the difference D as a result of the first comparison is beyond the predetermined range, a control code to advance a phase of the sampling pulse for analog-to-digital conversion by a predetermined value is supplied to the digital variable delay circuit 38. After a phase of the sampling pulse for analog-to-digital conversion is advanced in this manner, the system takes again the absolute values of differences in level between output signals of the analog-to-digital converting circuit 27 which alternately change in level in consecutive clock pulses during the test period, and integrates them during the test period to obtain an integrated value S3. And the system compares the integrated value S3 obtained in this manner with the previous integrated value S2. If the difference obtained from this comparison is still beyond the predetermined range, the system again determines whether or not the comparison is the first one after the initial setting. Since the comparison is the second one in this case, the system determines that it is not. Next, the system determines whether or not the difference as a result of the comparison decreases, and if it decreases the system changes the control code so as to advance further a phase of the sampling pulse for analog-to-digital conversion, but if the difference does not decease the system changes the control code so as to delay a phase of the sampling pulse for analog-to-digital conversion. By repeating such an operation, the difference between the integrated values of peak-to-peak values of test signals read out in successive horizontal blanking periods comes into the predetermined range, so that a phase of the sampling pulse for analog-to-digital conversion to be supplied to the sample and hold circuit 27a of the analog-to-digital converting circuit 27 may become optimal.

In the embodiments so far explained, a phase of the sampling pulse for analog-to-digital conversion is automatically adjusted by processing the test signals, but according to the invention, a phase of the sampling pulse for analog-to-digital conversion may be adjusted manually. FIG. 7 shows an embodiment of the solid state image pick up apparatus according to the invention, in which a phase of the sampling pulse is manually adjusted. In FIG. 7, a pulse phase adjuster 45 is provided in a signal path for the sampling pulse to be supplied from the reference oscillator 22 to the analog-to-digital converting circuit 27, a signal outputted from the analog-to-digital converting circuit 27 is supplied to a logic analyzer 46 or supplied to an oscilloscope 48 after converting it to an analog signal through a digital-to-analog converting circuit 47, and while reading a waveform corresponding to the test signal from waveforms displayed on the logic analyzer or oscillo-scope, the pulse phase adjuster 45 may be manually adjusted so that a difference in level between the black and white signals may be maximized. In the present embodiment, the pulse phase adjuster 45, as the former example shown in FIG. 1, is composed of a variable resistor, capacitor and buffer amplifier so as to adjust a pulse phase by adjusting the variable resistor, but a pulse phase adjuster of another type may be also used.

In the above-mentioned embodiments, the system is composed to adjust a phase of the sampling pulse for analog-to-digital conversion to be supplied to the analog-to-digital converting circuit 27 by processing the test signals. According to the invention, a phase of the sampling pulse for analog-to-digital conversion is adjusted in relation to a phase of the driving pulse of the CCD 21, the system may be made to fix a phase of the sampling pulse for analog-to-digital conversion to be supplied to the analog-to-digital converting circuit 27 and adjust a phase of the driving pulse for the CCD 21 by processing the test signals. Namely, the digital variable delay circuit 38 may be disposed between the reference clock oscillator 22 and the CCD driving gate array 23, as shown by a broken line in FIG. 4. In this case, of course, a clock pulse not passing through the digital variable delay circuit 38 is supplied to the analog-to-digital converting circuit 27 as a sampling pulse. In this case, a phase of the sampling pulse to be supplied to the correlative double sampling circuit 24 is adjusted, and the system does not compensate for a deviation between a phase of the signal read from the CCD 21 and a phase of the sampling pulse for the correlative double sampling circuit 24 but compensates a deviation between a phase of the analog image signal obtained by sampling in the correlative double sampling circuit 24 and a phase of the sampling pulse for analog-to-digital conversion in the analog-to-digital converting circuit 27.

In the above mentioned embodiments, the integrated values of peak-to-peak values of test signals inserted in consecutive horizontal blanking periods are successively compared with each other and a phase of the sampling pulse to be supplied to the analog-to-digital converting circuit 27 is adjusted to the optimal value so as to maximize the integrated value, namely, to maximize a level of the test signals, but according to the principle of the invention, it is ideal to detect a phase of the output signal after analog-to-digital conversion, compare this phase with a phase of the analog image signal to be inputted into the analog-to-digital converting circuit and compensate a phase of the sampling pulse for analog-to-digital conversion. However, if the system is made to directly detect a phase of the output signal obtained after the analog-to-digital conversion, there is a fear that the circuit construction becomes complicated. In an embodiment to be explained below, a phase of the sampling pulse for analog-to-digital conversion to be supplied to the analog-to-digital converting circuit is detected instead of a phase of the output image signal of the analog-to-digital converting circuit, the thus detected phase is compared with a phase of the input analog test signal, and a phase of the sampling pulse for analog-to-digital conversion is controlled. This embodiment may be realized by a relatively simple circuit construction.

FIG. 8 shows a fourth embodiment of the solid state image pickup apparatus according to the invention and similar parts of this embodiment are denoted by the same reference numerals used in the previous embodiments and detailed description thereof is omitted. In the embodiment, a pulse generating circuit for generating a driving pulse for the CCD 21 and a sampling pulse for the correlative double sampling circuit 24 is shown by reference number 101. A signal which has been sampled by the correlative double sampling circuit 24 and has passed through the low-pass filter 25 and analog signal processing circuit 26 (shown in FIG. 9A) is supplied to a gate circuit 102. The gate circuit 102, to which a gate pulse for extracting the test signal included in the output signal read out of the CCD 21 is supplied from the pulse generating circuit 101 as shown in FIG. 9C, extracts the test signal as shown in FIG. 9B. FIG. 9E shows a part of the test signal shown in FIG. 9B in an enlarged time scale. The test signal is supplied to a waveform shaping circuit 103 to generate a signal 9F rising and falling at consecutive zero-crossing points as shown in FIG. 9F, and this signal 9F is supplied to one input terminal of a phase comparator 104a comprising a digital phase comparing circuit 104. The digital phase comparing circuit 104 may be composed of "MC4044" or "CX23065A" device for example.

A first sampling pulse (hereinafter referred to as S/H1) to be supplied to the correlative double sampling circuit 24 is also supplied to an analog type variable delay line 105, and an output pulse of the variable delay line 105 is supplied as a second sampling pulse (hereinafter referred to as S/H2) to the sample and hold circuit 27a of the analog-to-digital converting circuit 27 through a fine-adjustment delay circuit 107. Therefore, the second sampling pulse is a pulse which is the basis of the sampling pulse for analog-to-digital conversion described above. The first and second sampling pulses S/H1 and S/H2 are shown in FIGS. 9G and 9H, respectively.

The second sampling pulse S/H2 generated from the variable delay line 105 is also supplied to a ½ frequency divider 106, and this frequency divider generates a signal having a duty cycle of 50% and having a frequency equal to a half of the frequency of the first and second sampling pulses and this signal is supplied to the other input terminal of the phase comparator 104a. Therefore, the phase comparator 104a compares a phase of the signal shown in FIG. 9F obtained by shaping the waveform of the test signal shown in FIG. 9E with a phase of the signal shown in FIG. 9I and supplies a signal (in FIG. 9D) corresponding to the phase difference to the variable delay line 105 to control a phase of the second sampling pulse S/H2. Thus, a so-called PLL (Phase Locked Loop) is composed in which a phase difference between the signal shown in FIG. 9F and the signal shown in FIG. 9I becomes zero. To make the drawing easy to understand, an output signal of the low-pass filter 104c shown in FIG. 9D is drawn as if its amplitude greatly varies, but actually its variation is very small.

As described above, since the signal shown in FIG. 9F is generated on the basis of the zero-crossing points of the test signal shown in FIG. 9E, the phase of the second sampling pulse shown in FIG. 9H is shifted by 90 degrees from the ideal phase position of the sampling pulse for analog-to-digital conversion. Therefore, the phase of the phase-controlled second sampling pulse S/H2 outputted from the variable delay line 105 is delayed by 90 degrees and the phase-delayed second sampling pulse S/H2 is passed through the fine-adjustment delay circuit 107 which compensates a delay time from a point in time when the sampling pulse for analog-to-digital conversion is supplied into the analog-to-digital converting circuit 27 to a point in time when the sample and hold processing of the inputted sampling pulse is actually performed to generate the sampling pulse for analog-to-digital conversion, and the thus derived sampling pulse is supplied to the sample and hold circuit 27a of the analog-to-digital converting circuit 27.

A gate pulse generated by the pulse generating circuit 101 is also supplied to the phase comparator 104a, and the phase comparator is operated only for a time period during which the test signal is included in the image signal read out of the CCD 21.

Figure 10:
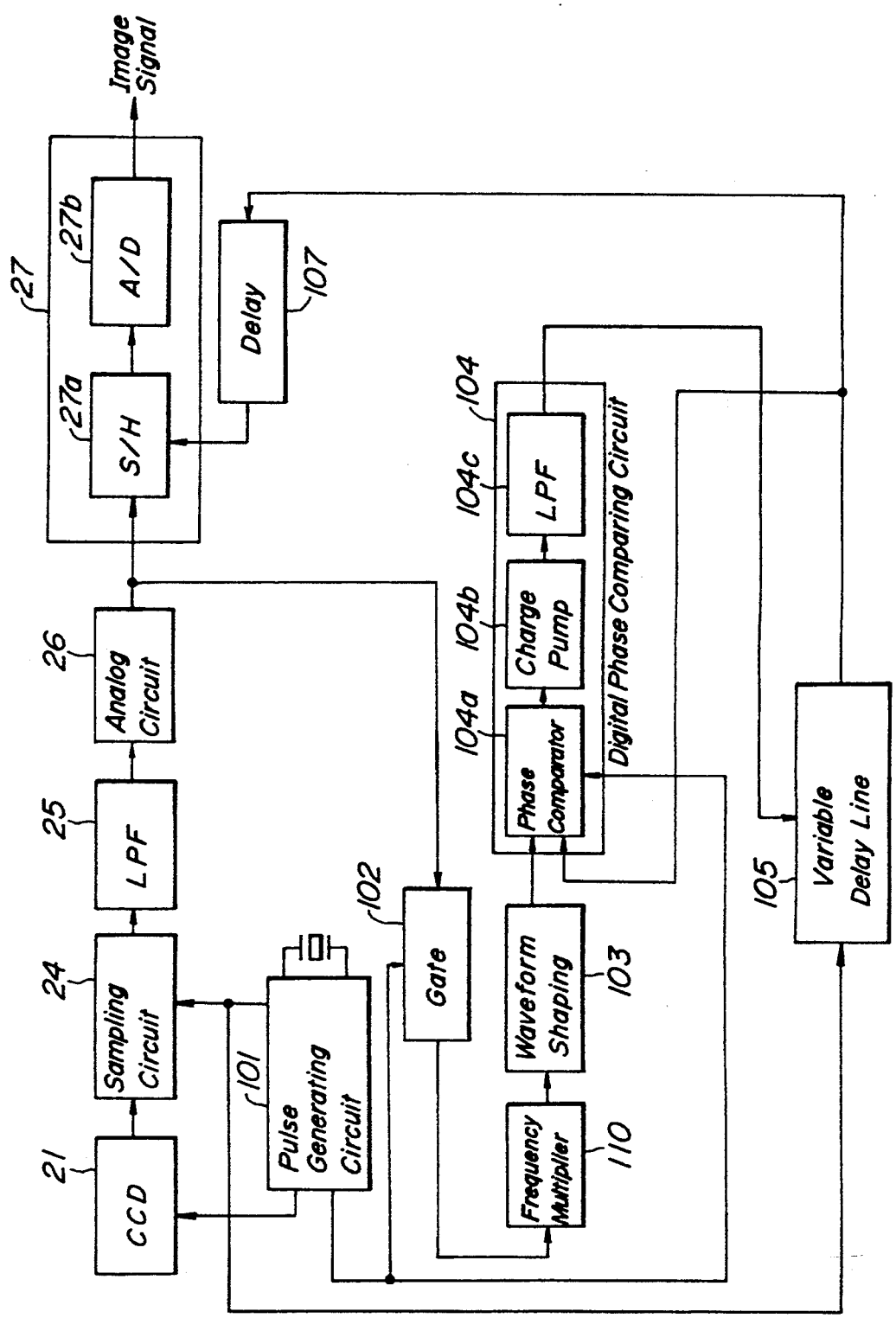
FIG. 10 is a block diagram showing the construction of a modification of the solid state image pickup apparatus according to the invention shown in FIG. 8.

FIG. 10 shows a fifth embodiment of the solid state image pickup apparatus according to the invention and is similar to the fourth embodiment shown in FIG. 8. In the present embodiment, a phase of the signal obtained by doubling the test signal in frequency is compared with a phase of the second sampling pulse S/H2 instead of comparing a phase of the waveform-shaped test signal outputted from the waveform shaping circuit 103 with a phase of the signal obtained by dividing the frequency of the second sampling pulse S/H2 generated from the variable delay line 105 by two (as in FIG. 8).

In the present embodiment, the frequency of the test signal extracted by the gate circuit 102 is multiplied by two by means of a frequency multiplier circuit 110 and a doubled test signal having the frequency is supplied to the waveform shaping circuit 103. The second sampling pulse S/H2 produced by the variable delay line 105 is supplied to the phase comparator 104a.

FIG. 11 is a circuit diagram showing the concrete construction of an embodiment of the frequency multiplier circuit 110. In the frequency multiplier circuit 110, a signal $\sin \omega t$ given to an input terminal 111 is supplied to one input terminal of a multiplier 112 and a signal $\cos \omega t$ obtained by passing the signal $\sin \omega t$ through a delay line 113 giving a phase delay of ¼λ (90°) is supplied to the other input terminal of the multiplier 112. Thus, the multiplier 112 produces a signal having a frequency doubled, which signal may be expressed by an expression of $\sin \omega t \cdot \cos \omega t = \frac{1}{2} \sin 2\omega t$.

Such a frequency multiplier circuit has been widely known and various frequency multiplier circuits other than the above-mentioned one have been known. According to the invention any frequency multiplier circuit may be used.

FIG. 12 is a circuit diagram showing a concrete construction of an embodiment of the analog type variable delay line 105 used in the fourth and fifth embodiments of the invention shown in FIGS. 8 and 10. The present embodiment is composed by multiple cascade connections of a number of parallel circuits of coils and variable-capacitance diodes and adjusts a phase of an input signal $V_{IN}$ in accordance with a control voltage $V_{DL}$ to produce an output signal $V_{OUT}$. According to the invention, the analog type variable delay line 105 is not limited to such construction, but any other types of the analog type variable delay line may be used.

In the embodiments shown in FIGS. 8 and 10, the output signal of the digital phase comparing circuit 104 is supplied to the analog type variable delay line 105 as the control signal, but of course a digital type variable delay line also can be used instead of the analog type variable delay line. In this case, an analog-to-digital converter needs to be provided between the digital phase comparing circuit 104 and the digital variable delay circuit.

Figure 13:
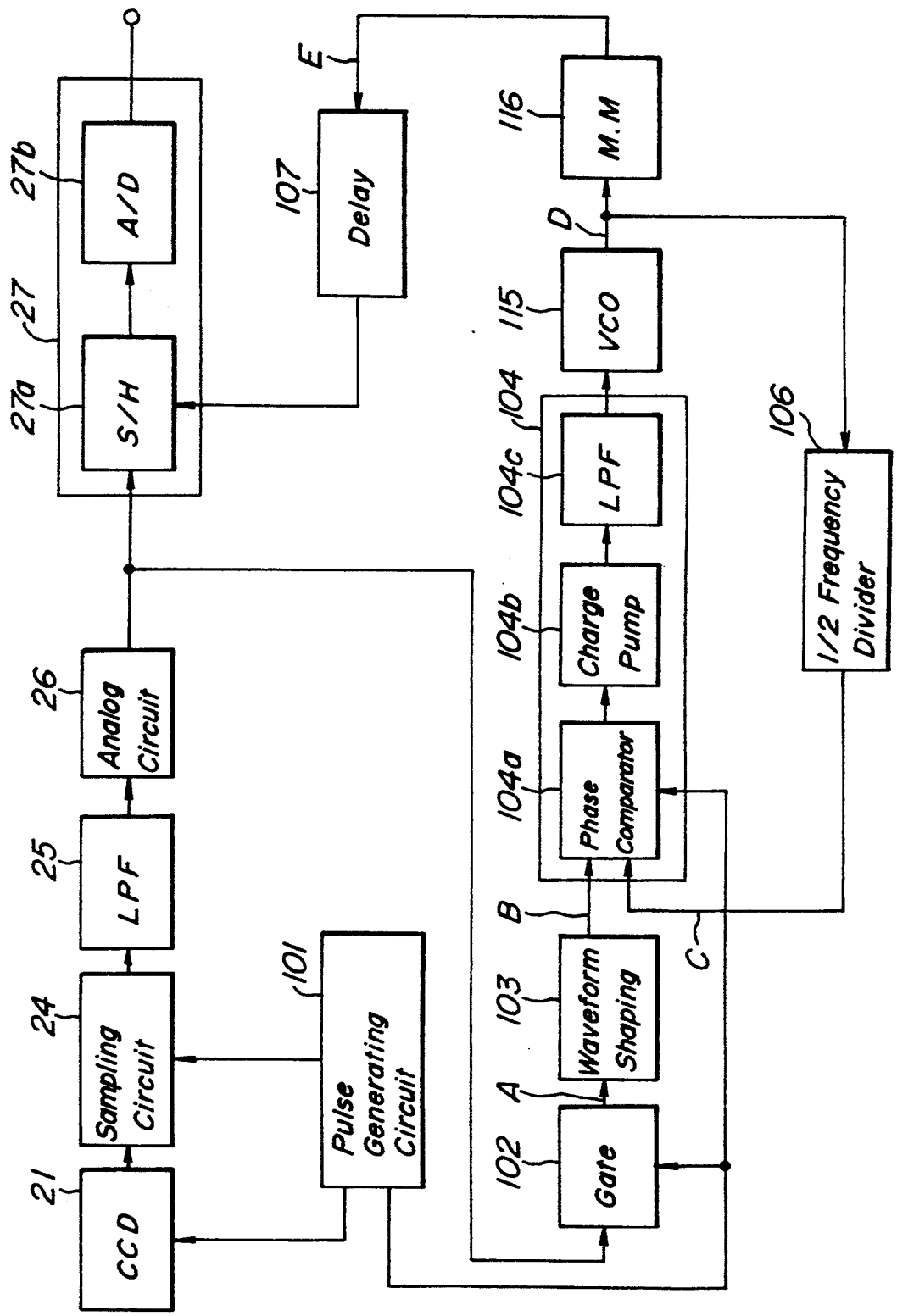
FIG. 13 is a block diagram representing the construction of another modification of the solid state image pickup apparatus illustrated in FIG. 8.

FIG. 13 shows the construction of a sixth embodiment of the solid state image pickup apparatus according to the invention, which is similar to the fourth embodiment shown in FIG. 8. In the present embodiment, the second sampling pulse whose phase is controlled is derived by connecting a VCO 115 (voltage controlled oscillator) to the output side of the phase comparing circuit 104. Namely, a signal (shown in FIG. 14B) obtained by shaping the test signal (shown in FIG. 14A) extracted in the gate circuit 102 by means of the waveform shaping circuit 103 is supplied to one input terminal of the phase comparator 104a of the digital phase comparing circuit 104.

An output signal of the digital phase comparing circuit 104 is supplied to the VCO 115 and a signal (shown in FIG. 14C) obtained by passing an output signal (shown in FIG. 14D) of the VCO 115 through a ½ frequency divider 106 is supplied to another input terminal of the phase comparator 104a. In this manner, a phase difference between the two signals supplied to the phase comparator 104a can be controlled to become zero.

Figure 14:
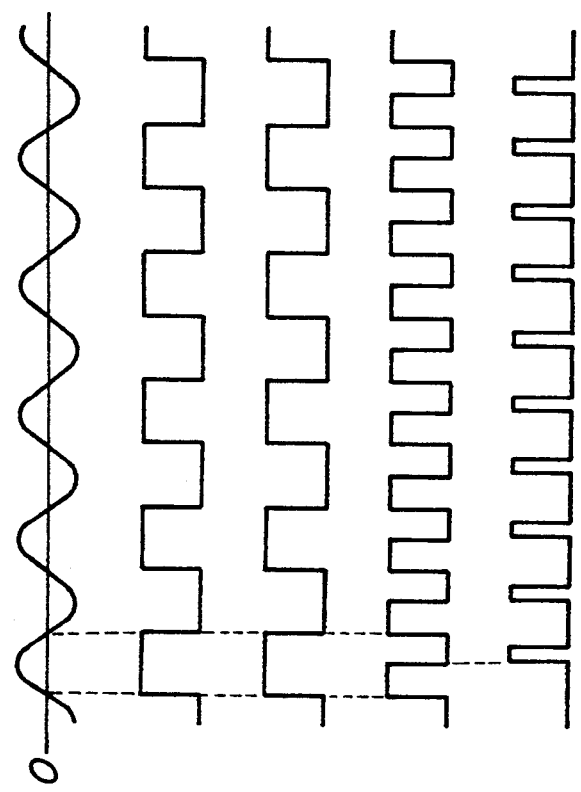
FIGS. 14A to 14E are signal waveform diagrams for explaining the operation of the apparatus shown in FIG. 13.

Further, an output signal of the VCO 115 is supplied to the monostable multivibrator 116 to generate the second sampling pulse S/H2 as shown in FIG. 14E, this sampling pulse is supplied through the fine-adjustment delay circuit 107 to generate the sampling pulse for analog-to-digital conversion, and this sampling pulse is supplied to the sample and hold circuit 27a of the analog-to-digital converting circuit 27.

Figure 15:
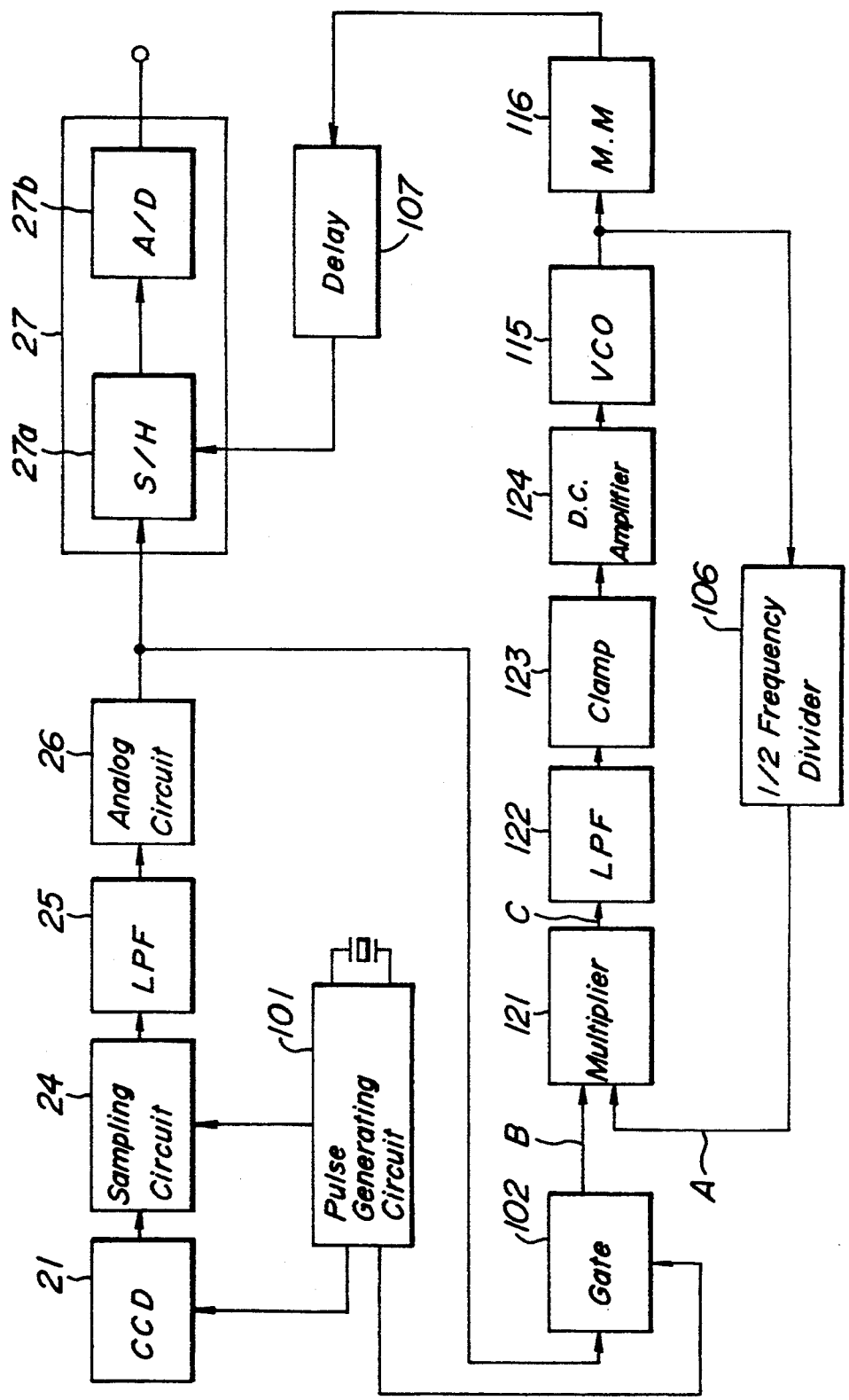
FIG. 15 is a block diagram showing the construction of still another modification of the solid state image pickup apparatus according to the invention illustrated in FIG. 8.

FIG. 15 shows a seventh embodiment of the solid state image pickup apparatus according to the invention, which is a modification of the embodiment shown in FIG. 13. In the embodiment shown in FIG. 13, the control signal to be supplied to the VCO 115 is derived by the digital phase comparing circuit 104, but in the present embodiment, the control signal is formed by a multiplier 121. Namely, in the present embodiment, the test signal extracted by the gate circuit 102 is supplied to one input terminal of the multiplier 121 and a signal obtained by demultiplying an output signal of the VCO 115 by means of the ½-frequency divider 106 is supplied to another input terminal of the multiplier 121. An output signal of the multiplier 121 is supplied to the VCO 115 through a low-pass filter 122, a clamping circuit 123 and a direct current amplifier 124.

Figure 16A:
FIG. 16A to 16I are signal waveform diagrams for explaining the operation of the apparatus shown in FIG. 15.
Figure 16B:
Figure 16C:
Figure 16D:
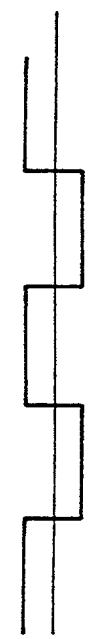
Figure 16E:
Figure 16F:
Figure 16G:
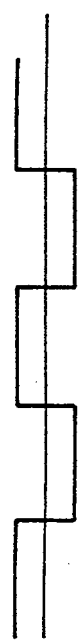
Figure 16H:
Figure 16I:

FIGS. 16A–16I show signal waveforms for explaining the operation of the present embodiment. In the present embodiment, when a phase difference between the signal (shown in FIG. 16A) obtained by frequency-dividing the output signal of the VCO 115 by means of the ½ frequency divider 106 and the test signal (shown in FIG. 16B) is 90° the system is in a stable state, where the output signal of the multiplier 121 alternately and symmetrically shows the positive polarity and negative polarity as shown in FIG. 16C and therefore a d.c. control voltage to be applied to the VCO 115 becomes zero. On the other hand, when the two signals (shown in FIGS. 16A and 16B) are the same in phase, a control voltage of positive polarity is applied to the VCO 115 as shown in FIGS. 16D to 16F and when the two signals are reverse to each other in phase, a control voltage of negative polarity is applied to the VCO 115 as shown in FIGS. 16G to 16I. Therefore, the phase difference is kept stable at 90° by controlling the VCO 115 so that an average of output of the multiplier 121 applied to the VCO 115 may become zero.

In the present embodiment also, the output signal of the VCO 115 is supplied to the monostable multivibrator 116 to form the second sampling pulse S/H2, the second sampling pulse S/H2 is passed through the fine-adjustment delay circuit 107 to generate the sampling pulse for analog-to-digital conversion, and this sampling pulse is supplied to the analog-to-digital converting circuit 27. In the same way as the above-mentioned embodiment, a delay time of the fine-adjustment delay circuit 107 can be determined by considering a delay time from a point in time when the sampling pulse for analog-to-digital conversion is supplied to the sample and hold circuit 27a of the analog-to-digital converting circuit 27 to a point in time when the sample and hold processing of the entered sampling pulse is actually performed.

Now several examples of the CCD 21 used in the above-mentioned embodiments will be explained.

In an embodiment shown in FIGS. 17A and 17B, a test signal generating part is formed on a semiconductor chip 51 having a CCD formed therein to obtain an integrated body. Namely, as shown in FIG. 17A, on the semiconductor chip 51, there are integrally formed an image part 52 for receiving an image of an object to be picked up and converting the image into an electric image signal, a test signal generating part 53 disposed on the right of the image part 52, a shift register 54 for horizontal transfer, and a reading amplifier 55 which is provided on the output side of the shift register 54 and is generally called a floating diffusion amplifier. The test signal generating part 53 has an array of pixels which are disposed at intervals of the same pixel pitch as the image part 52 both in the horizontal and vertical scanning directions and in the array a white pixel line of white pixels 56 and a black pixel line of black pixels 57 in the vertical scanning direction are alternately disposed in the horizontal scanning direction. To do this, each of white pixels 56 is connected with an electric charge injecting amplifier 58 so as to inject electric charge equivalent to the white level into it. The test signal generating part 53 is covered with a mask so as to prevent light from being incident thereupon, since it does not need to receive light.

In the embodiment shown in FIGS. 17A and 17B, a white test signal is formed by injecting electric charge into each pixels of a part of a CCD and a black test signal is generated by masking each pixel of the rest of the CCD. According to the present embodiment, other similar methods can be utilized for generating the test signal.

For example, a white defect, which is a defect of a pixel generating an abnormally great dark current, is intentionally formed and the thus formed white pixel part 56 is positively utilize for generating the white test signal and a pixel defect called a black defect is intentionally formed as the black pixel part 57. The black pixel generating the black signal may be formed by eliminating its photoelectric conversion function and utilizing only its charge transfer function.

In the embodiment shown in FIGS. 17A and 17B, each of the white pixels 56 generating the white test signal are connected with respective amplifiers 58, but one amplifier may be connected with all white pixels in parallel with each other.

By using the CCD 21 in which the test signal generating part 53 is integrally formed as one chip, it is possible to obtain an image signal having a test signal included in its horizontal blanking period as shown in FIG. 18 by transferring electric charges stored in the pixels aligned along a horizontal scanning line over the image part 52 and test signal generating part 53 to the shift register 54 for horizontal transfer, reading the electric charges one after another from the shift register 54, and amplifying them by means of the reading amplifier 55. FIG. 18 shows the image signal obtained in case of picking up an image of an object which continuously varies from black to white viewed in the horizontal direction.

In the present embodiment, it is possible to utilize the black test signal as the optical black also. In such a case, it is unnecessary to additionally provide an area of the optical black and makes it possible to make a CCD chip smaller in size.

FIG. 19 is a schematic view showing another embodiment of the CCD 21 used in the present invention. In the present embodiment, an image part 52 and a horizontal transfer shift register 54 are formed as one unit on a semiconductor chip, and a test signal generating part 59 comprising an array of alternate white pixels and black pixels at an end of the horizontal transfer shift register 54 and an electric charge injecting amplifier 60 for injecting an electric charge into the white pixel are formed as one unit on the same chip 51. An image signal having the test signal attached in each horizontal blanking period can be derived by reading the horizontal transfer shift register 54 which is equipped with the test signal generating part 59 at an end of it.

FIG. 20 is a schematic view illustrating another embodiment of the CCD 21 used in the invention. In the above mentioned embodiments, a test signal generating part is formed as one unit on the semiconductor chip 51 forming the image part 52 on it, but in the present embodiment, a pulse generator 61 for generating a pulse signal having double the period of a reading clock signal during only a specified period in a horizontal blanking period is provided separately from the semiconductor chip 51, and the pulse signal generated 61 by the pulse generator is supplied to an electric charge injecting amplifier 62 connected to the horizontal transfer shift register 54. Therefore, from this electric charge injecting amplifier 62 electric charges corresponding to the white level and black level are alternately injected into the horizontal transfer shift register 54 synchronously with a CCD driving pulse during a specified period in a horizontal blanking period, these charges are transferred through the shift register 54, and an image signal having the test signal attached in a horizontal blanking period is read from the reading amplifier 55.

According to the invention, the test signal may be inserted anywhere of the image signal as long as the test signal is synchronized with the output signal of the horizontal transfer shift register 54.

FIGS. 21 and 22 show still other embodiments of the CCD 21 having the test signal generating function. In the above mentioned embodiments, the test signal is generated by alternately injecting electric charges respectively corresponding to the white and black levels into the horizontal transfer shift register, but in the embodiments shown in FIGS. 21 and 22 the test signal is produced with aid of an optical means. In the embodiment shown in FIG. 21, a test signal generating CCD 64 is provided in a package 63 holding an image signal generating CCD 21 in it, a light shielding mask 65 is provided on every other pixels of the test signal generating CCD 64, light emitted from a light source 67 having a mirror 66 is made incident upon an optical fiber cable 69 through to illuminate the test signal generating CCD 64 uniformly by an illuminating member 70 coupled with the optical fiber cable 69. An optical member for irradiating a bias light in a television camera as described for example in Japanese Patent Application Publication Kokai Sho 62-21313 may be used as such an illuminating member 70.

In the embodiment shown in FIG. 22, a CCD 72 used as the optical black and a CCD 73 for generating the test signal are provided adjacently to an image signal generating part 71 of the CCD 21. A part corresponding to a black pixel of the test signal generating CCD 73 is covered with a light shielding mask 74 as shown by a hatched area and the test signal generating CCD 73 is uniformly illuminated by means of an illuminating means similar to the illuminating means 70 shown in FIG. 21. Thus, an image signal having the test signal attached in a specified period during a horizontal blanking period can be obtained by consecutively reading the image signal generating CCD 71, the optical black CCD 72, and the test signal generating CCD 73.

Figure 23:
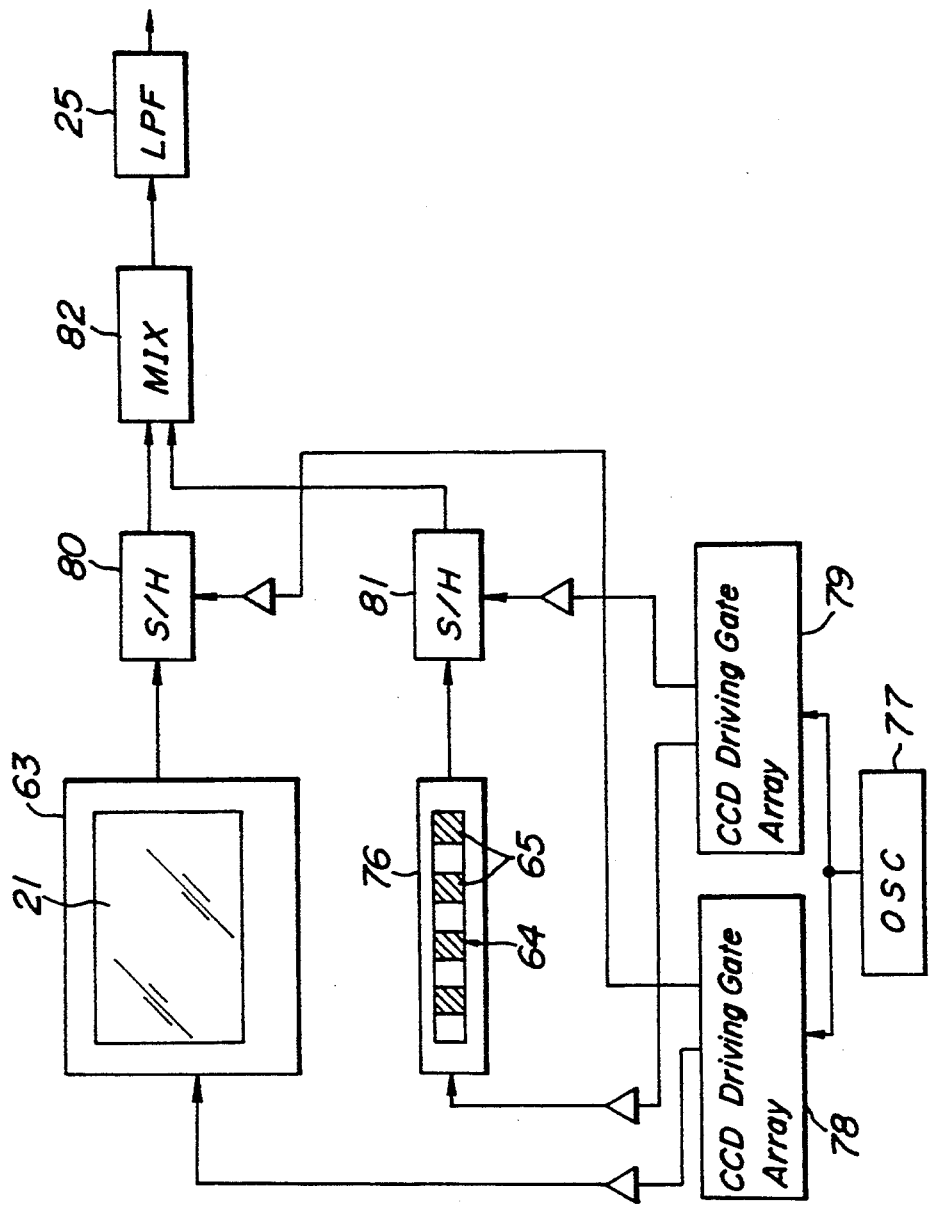
FIG. 23 is a schematic view illustrating a modification of the solid state image pickup device according to the invention shown in FIG. 21.

FIG. 23 shows a variation of the embodiment shown in FIG. 21. In FIG. 21, the test signal generating CCD 64 is contained in the same package 63 in which the image signal generating CCD 21 is provided, but in the present embodiment these CCDs are provided as completely separate units. Namely, a test signal generating CCD 64 is contained in a dedicated package 76. FIG. 23 shows also the construction of a driving circuit of the image signal generating CCD 21 and test signal generating CCD 64 and a circuit for processing the thus read out signal. A reference clock pulse signal generated by a reference oscillator 77 is supplied to first and second CCD driving gate arrays 78 and 79 to produce a driving pulse signal for the image signal generating CCD 21, a driving pulse signal for the test signal generating CCD 64, a sampling pulse signal to be supplied to a first correlative double sampling circuit 80 for sampling a signal read from the image signal generating CCD and a sampling pulse signal to be supplied to a second correlative double sampling circuit 81 for sampling a signal read from the test signal generating CCD. There is further provided a mixing circuit 82 for mixing output signals of the first and second correlative double sampling circuits 80 and 81. Thus, the image signal having the test signal attached in a specified period during a horizontal blanking period can be obtained from the mixing circuit 82 as shown in FIG. 18.

FIG. 24 to 27 are schematic views showing the construction of several embodiments of the color television camera to which the solid state image pickup apparatus according to the invention is applied.

Figure 24:
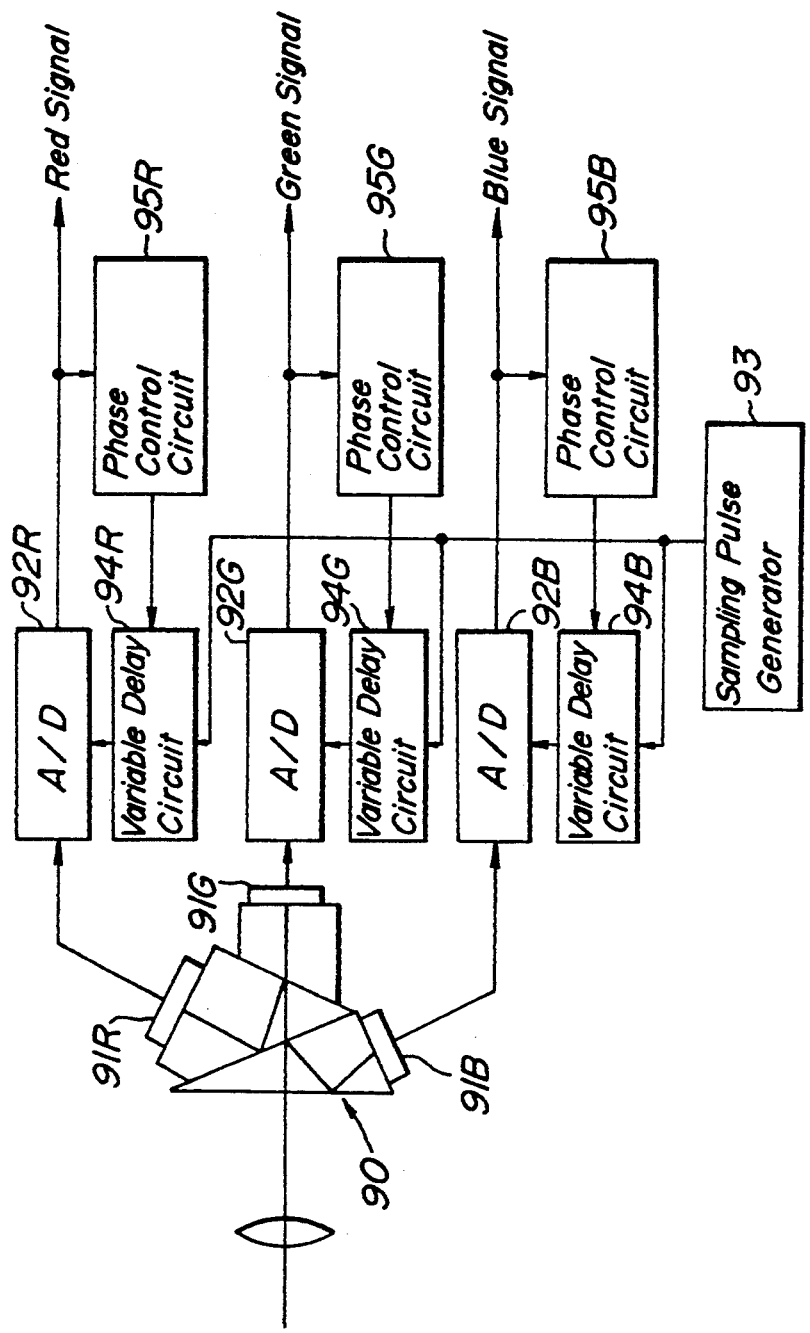
FIG. 24 is a schematic view showing the construction of an embodiment of a color television camera using the solid state image pickup devices according to the invention.

In the embodiment shown in FIG. 24, red, green and blue color signals are derived by sampling by means of respective analog-to-digital converting circuit 92R, 92G and 92B the signals read out of CCDs 91R, 91G and 91B respectively for picking up red, green and blue images of an object which are obtained by color separation by means of a three color separation optical system 90. In practice, correlated double sampling circuits, low-pass filters, analog circuits and the like are provided between the respective CCDs 91R, 91G and 91B and the analog-to-digital converting circuits 92R, 92G and 92B, but they are omitted to simplify the drawing. A sampling pulse for analog-to-digital conversion generated by a sampling pulse generator 93 is supplied to the analog-to-digital converting circuits 92R, 92G and 92B respectively through variable delay circuits 94R, 94G and 94B. In the present embodiment, an image signal having the test signal attached in a horizontal blanking period is derived from each of the CCD 91R, 91G and 91B, the test signals are derived from the output signals from the analog-to-digital converters 92R, 92G and 92B by means of phase control circuits 95R, 95G and 95B and these test signals are supplied to the variable delay circuits 94R, 94G and 94B as the control signal to automatically control a phase of the sampling pulse for analog-to-digital conversion such that the image signals can be sampled at optimum sampling timings. In this manner, the phases of these sampling pulses can be adjusted independently from the respective color image signals.

Figure 25:
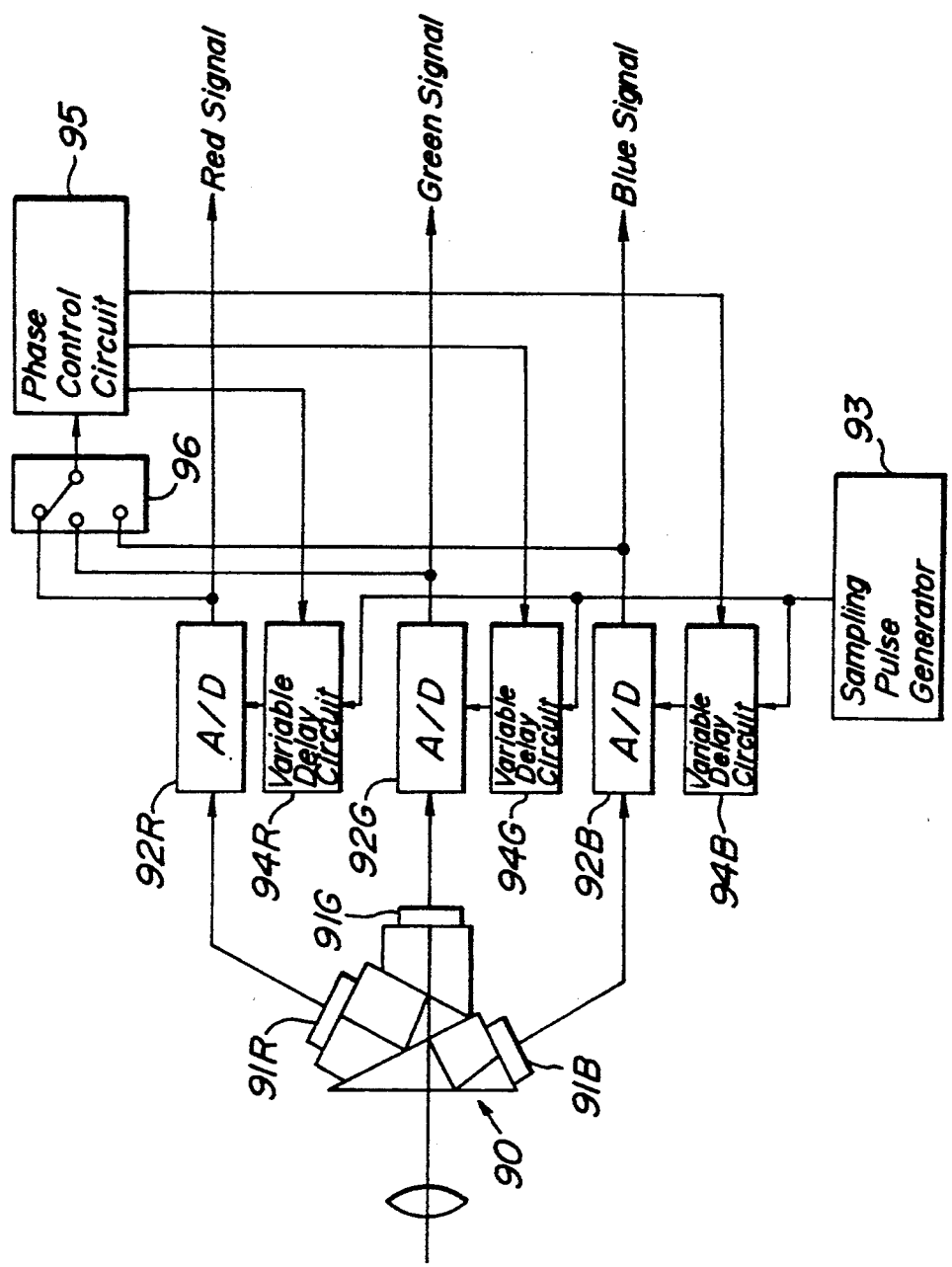
FIG. 25 is a schematic view depicting the construction of another embodiment of the color television camera using the solid state image pickup devices according to the invention.

FIG. 25 shows a second embodiment in case of applying the invention to the color television camera. Since a phase of the sampling pulse does not need to be adjusted so quickly, in the present embodiment a signal selected by a changeover switch 96 from the output signals of the analog-to-digital converting circuits 92R, 92G and 92B is supplied to a phase control circuit 95. For example, when the red signal is selected as shown in FIG. 25, the test signal contained in this red signal is extracted to produce a phase control signal and the thus extracted test signal is supplied to the variable delay circuit 94R for controlling a phase of the sampling pulse for analog-to-digital conversion to be supplied to the analog-to-digital converting circuit 92R for sampling the red signal. Then, a phase of the sampling pulse for analog-to-digital conversion is controlled such that the red signal is sampled at optimum timings. Next, the changeover switch 96 is changed to extract the the green signal and the variable delay circuit 94G is controlled so as to sample the green signal at optimum timings. Further the changeover switch 96 is derived again to extract the blue signal and the variable delay circuit 94B is controlled such that the blue signal can be sampled at optimum timings. In this manner, phases of all the sampling pulses for analog-to-digital conversions can be controlled such that all the red, green and blue signals can be sampled at respective optimum timings.

The above-mentioned changeover switch 96 may be automatically changed over, but since the phase control of the sampling pulses can be performed for a long time, in the present embodiment, the switch 96 is manually operated. In case of automatically changing over the switch 96, the changeover of the switch 96 may be carried out when a difference between integrated values of the absolute values of peak-to-peak values of the test signal comes into a specified acceptable range as explained with reference to FIG. 4 or when after a predetermined time has passed.

Figure 26:
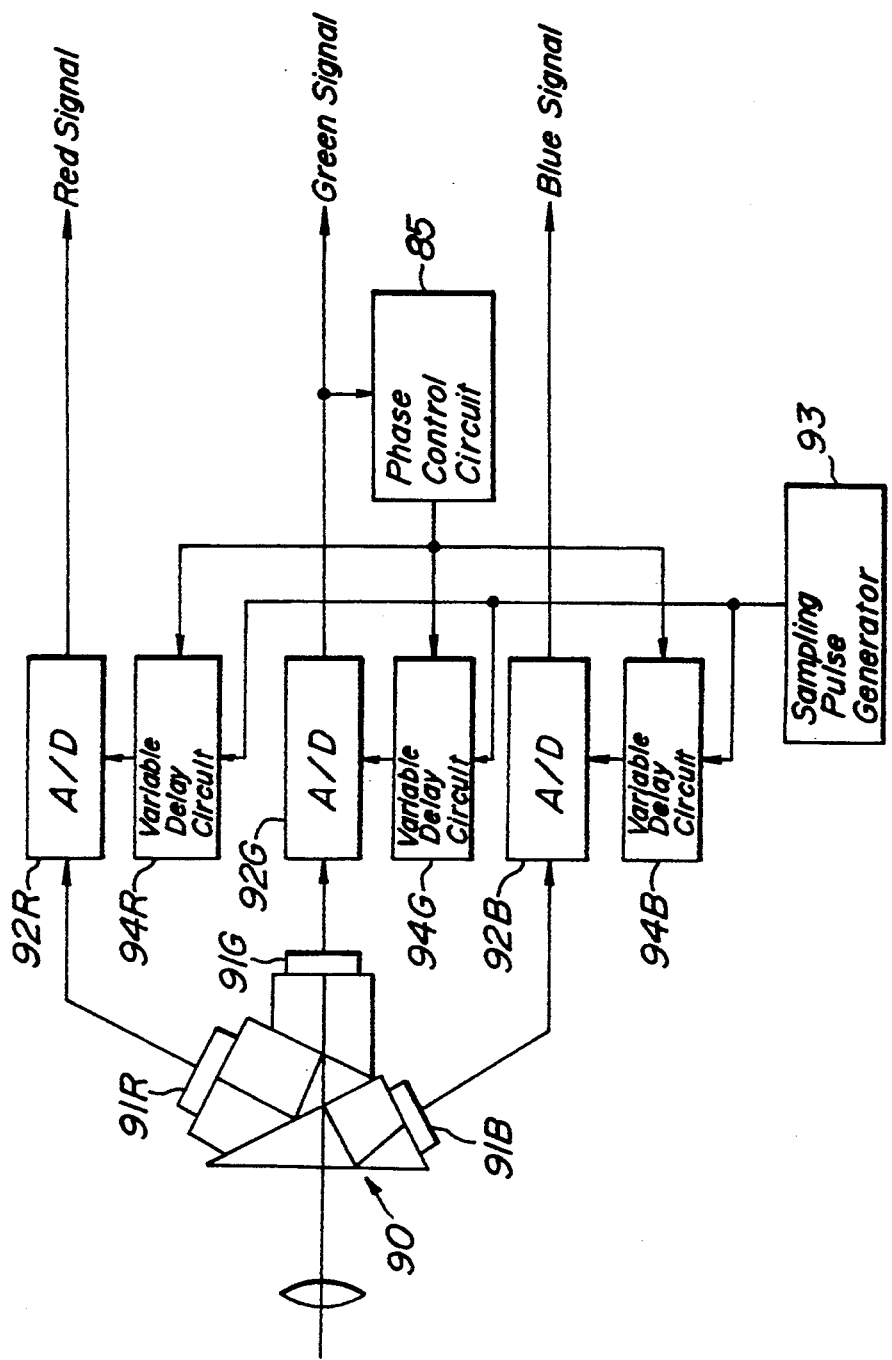
FIG. 26 is a schematic view representing the construction of another embodiment of the color television camera using the solid state image pickup devices according to the invention.

FIG. 26 shows still another embodiment of the color television camera to which the solid state image pickup apparatus according to the invention is applied. In the present embodiment, the green signal derived from the analog-to-digital converting circuit 92G is supplied to the phase control circuit 95, the test signal contained in the green signal is extracted, a phase control signal is produced on the basis of the the thus extracted test signal, and the thus produced phase control signal is commonly supplied to the variable delay circuits 94R, 94G and 94B for controlling phases of the sampling pulses to be supplied to respective analog-to-digital converting circuits 92R, 92G and 92B. In this manner, the sampling pulse phases in all the color signal channels are commonly controlled by the single phase control signal obtained by processing the test signal contained in one color signal, the whole system becomes simple in construction. Since these color signal channels are the same in construction and variations in delay times of these channels are nearly equal to each other, a control error due to such a common control is very small. In the present embodiment, the phase control signal is derived only from the green signal, and therefore only the green CCD 91G is sufficient to be constructed such that it produces the test signal and each of the remaining CCDs 91R and 91B can be composed as an ordinary CCD.

FIG. 27 shows another embodiment of the color television camera to which the solid state image pickup apparatus according to the invention is applied. In the present embodiment, the red, green and blue signals are supplied to a brightness matrix 97 and are mixed therein at a specified proportional ratio to produce a brightness signal, and thus obtained brightness signal is supplied to the phase control circuit 95. In the present embodiment test signals are inserted in these color signals, so these test signals are also mixed at the specified proportional ratio. The phase control circuit 95 extracts a composite test signal obtained in this manner to produce a phase control signal. The thus produced phase control signal is supplied commonly to the variable delay circuits 94R, 94G and 95B for controlling phases of the sampling pulses for analog-to-digital conversions to be supplied to analog-to-digital converting circuits 92R, 92G and 92B.

The invention is not limited only to the above-mentioned embodiments, but can be variously modified and altered.

For example, in the above mentioned embodiments, the test signal is inserted in a horizontal blanking period, but it may be also inserted in a vertical blanking period as a period having no effect on an image signal. In this case, since the test signal is obtained only once in a field, a time required for adjusting a phase of the sampling pulse for analog-to-digital conversion is longer than the above mentioned embodiments, but there is no problem, because it is not necessary to perform the phase adjustment quickly. Furthermore, in the invention, the test signal does not need to be inserted in a blanking period, but may be also generated in an image signal period. For example, a test signal generating CCD for one scanning line may be provided and may be consecutively read out in a test mode.

And in the above mentioned embodiments, a phase of the sampling pulse for analog-to-digital conversion for sampling the image signal after being processed in circuits having more factors of variation of a delay time is adjusted on the basis of the test signal, but a phase of the sampling pulse to be supplied to the correlative double sampling circuit usually arranged immediately after a CCD may be also adjusted. Particularly in the hi-vision system, since only a very small deviation of a sampling timing has a great effect on the image quality, it is desirable to control also a phase of the sampling pulse to be supplied to the correlative double sampling circuit.

Furthermore, in the above mentioned embodiments, the test signal inserted in a horizontal blanking period of the image signal is set to be a signal which comes alternately to the white level and black level at intervals of one pixel pitch, but according to the invention, the levels to which the test signal alternately comes do not need to be equal to the white level and black level, but may be set any desired levels so long as difference between them is definite. Further, the solid state image pickup device for generating the image signal including the test signal may be varied in various ways.

According to the invention as described above, the test signal for adjusting the timings for sampling the image signal is added to the image signal, and therefore it is no more necessary to prepare a test chart having a special black and white stripe pattern, an illuminating apparatus for illuminating the test chart, a tripod for supporting the television camera, and the like as required up to now, and the troublesome setting of this equipment is also not required. This has the result that the sampling timing can be correctly adjusted to a desired timing with ease and no skillfulness is required.

If a phase of the sampling pulse is automatically adjusted by processing the test signal included in the image signal, the phase adjustment is much easier and more accurate.

In the above mentioned embodiments, the test signal is read out of the same CCD from which the image signal is read out, an additional circuit for generating the test signal is greatly simplified, so this method can be implemented by only slightly changing the design of the solid state image pickup apparatus containing an existing CCD.

Furthermore, the test signal generated in the solid state image pickup apparatus according to the invention can also be used as a reference signal for adjusting phases among the R, G and B signals in an analog television camera using a CCD.

Still further, also in a television camera having a pixel shifting, it can be easily determined by using the test signal whether or not signals are supplied to encoders in an analog processing system after CCD under a proper phase relationship.

We claim:

1. A solid state image pickup apparatus comprising:
   a solid state image pickup device for receiving an optical image of an object and generating an electrical image signal representing said optical image of the object in synchronism with a driving pulse;
   driving means for generating said driving pulse to be supplied to said solid state image pickup device;
   sampling means for generating a sampled image signal by sampling said electrical image signal read out of the solid state image pickup device by means of a first sampling pulse synchronized with said driving pulse;
   first pulse means for generating said first sampling pulse to be supplied to said sampling means;
   analog-to-digital converting means for converting said sampled image signal to a digital image signal by means of a second sampling pulse for analog-to-digital conversion;
   second pulse means for generating said second sampling pulse for analog-to-digital conversion to be supplied to said analog-to-digital converting means;
   test signal generating means for generating a test signal which is synchronized with said driving pulse and alternately changes in level between consecutive pixels; and
   control means for controlling a phase of said first sampling pulse and a phase of said second sampling pulse for analog-to-digital conversion relative to each other by processing said test signal.

2. A solid state image pickup apparatus as defined in claim 1, wherein said test signal generating means generates said test signal during a horizontal blanking period of an output signal of said solid state image pickup device and said sampling means samples the test signal in the same manner as said electrical image signal read out of the solid state image pickup device.

3. A solid state image pickup apparatus as defined in claim 1, wherein said test signal generating means generates the test signal during a vertical blanking period of an output signal of said solid state image pickup device and said sampling means samples the test signal in the same manner as the electrical image signal read out of the solid state image pickup device.

4. A solid state image pickup apparatus as defined in claim 3, wherein a digital test signal is produced by converting said test signal by means of said analog-to-digital converting means and is supplied to said control means, and the control means includes an automatic phase adjusting means for automatically adjusting the phase of said second sampling pulse for analog-to-digital conversion by processing the digital test signal.

5. A solid state image pickup apparatus as defined in claim 4, wherein the automatic phase adjusting means produces absolute values of a difference between consecutive digital test signals, the absolute values are summed during a test-signal-inserted period to produce an integrated value, and the phase of the first sampling pulse is automatically controlled on the basis of differences between consecutive integrated values respectively corresponding to consecutive test-signal-inserted periods.

6. A solid state image pickup apparatus as defined in claim 5, wherein the automatic phase adjusting means automatically controls the phase of the second sampling pulse for analog-to-digital conversion so that the integrated value becomes maximum.

7. A solid state image pickup apparatus as defined in claim 4, wherein the control means comprises a computer for computing and processing the digital test signal.

8. A solid state image pickup apparatus as defined in claim 3, wherein a digital test signal is produced by converting the test signal by means of the analog-to-digital converting means and is supplied to said control means, and the control means comprises:
   a logic analyzer for displaying a waveform of the digital test signal; and
   a phase adjuster for manually adjusting the phase of said second sampling pulse for analog-to-digital conversion based on observing the waveform of the digital test signal displayed on said logic analyzer.

9. A solid state image pickup apparatus as defined in claim 3, wherein a digital test signal is produced by converting the test signal by means of the analog-to-digital converting means and is supplied to the control means, and the control means comprises:
   a digital-to-analog converter for converting said digital test signal to an analog test signal,
   an oscilloscope for displaying a waveform of said analog test signal converted by the digital-to-analog converter, and
   a phase adjuster for manually adjusting the phase of the second sampling pulse for analog-to-digital conversion based on observing the waveform of the test signal displayed on said oscilloscope.

10. A solid state image pickup apparatus as defined in claim 3, wherein said control means compares a phase of the test signal to be entered into the analog-to-digital converting means for sampling the test signal and the phase of the first sampling pulse produces a comparison result, and automatically controls the phase of the first sampling pulse on the basis of said comparison result.

11. A solid state image pickup apparatus as defined in claim 9, wherein the control means comprises:
   a frequency divider for dividing a frequency of the second sampling pulse for analog-to-digital conversion by two,
   a digital phase comparator for comparing the phase of the second sampling pulse for analog-to-digital conversion whose frequency has been divided by said frequency divider with a phase of the test signal to be supplied to the analog-to-digital converting means, and
   a variable delay circuit for adjusting the phase of said first sampling pulse in accordance with an output of said digital phase comparator to generate the second sampling pulse for the analog-to-digital conversion.

12. A solid state image pickup apparatus as defined in claim 9, wherein the control means comprises:
   a frequency multiplier for doubling a frequency of the test signal to be supplied to the analog-to-digital converting means,
   a digital phase comparator for comparing a phase of the test signal whose frequency has been multiplied by the frequency multiplier with the phase of the second sampling pulse for analog-to-digital conversion, and
   a variable delay circuit for adjusting the phase of the first sampling pulse in accordance with an output signal of the digital phase comparator to generate the second sampling pulse for analog-to-digital conversion.

13. A solid state image pickup apparatus as defined in claim 9, wherein the control means comprises:
   a digital phase comparator for comparing a phase of the test signal to be supplied to the analog-to-digital converting means with the phase of the second sampling pulse for analog-to-digital conversion, and
   a voltage controlled oscillator for generating the second sampling pulse for analog-to-digital conversion and being controlled by an output signal of said digital phase comparator.

14. A solid state image pickup apparatus as defined in claim 9, wherein the control means comprises:
   a frequency divider for dividing a frequency of the second sampling pulse for analog-to-digital conversion by two,
   a multiplier for multiplying a signal generated from the frequency divider with the test signal to be supplied to the analog-to-digital converting means, and
   a voltage controlled oscillator for generating the second sampling pulse for analog-to-digital conversion and being controlled by an output signal of the multiplier.

15. A solid state image pickup apparatus as defined in claim 10, wherein the control means comprises:
   a fine-adjustment delay circuit for compensating a delay time from a point in time when the second sampling pulse for analog-to-digital conversion has been supplied to the analog-to-digital converting means to the point in time when the analog-to-digital conversion is actually performed.

16. A solid state image pickup apparatus as defined in claim 1, wherein said test signal generating means is incorporated in the solid state image pickup device and the test signal is obtained by reading the solid state image pickup device.

17. A solid state image pickup apparatus as defined in claim 1, wherein said test signal generating means is provided separately from the solid state image pickup device, and the test signal is generated by driving the test signal generating means synchronously with the driving pulse of the solid state image pickup device.

18. A solid state image pickup apparatus comprising:
   a color separation optical system for separating an optical image of an object into a plurality of color-separated optical images,
   a plurality of solid state image pickup devices for respectively receiving the plurality of color-separated optical images and generating respective electrical image signals in synchronism with respective driving pulses,
   driving means for generating said respective driving pulses to be supplied to said solid state image pickup devices,
   first pulse means for generating respective first sampling pulses synchronized with said respective driving pulses, and
   a plurality of signal processing channels, having respective sampling means for generating respective sampled image signals by sampling the respective electrical image signals from the respective solid state image pickup devices by means of the respective first sampling pulses, having respective analog-to-digital converting means for converting the respective sampled image signals to respective digital image signals by means of respective second sampling pulses for analog-to-digital conversion, and having respective second pulse means for generating the respective second sampling pulses for analog-to-digital conversion,
   wherein each of the signal processing channels comprises respective phase control means for controlling a phase of the respective second sampling pulse for analog-to-digital conversion in relation to the phase of the respective first sampling pulse.

19. A solid state image pickup apparatus comprising:
   a color separation optical system for separating an optical image of an object into a plurality of color-separated optical images,
   a plurality of solid state image pickup devices for respectively receiving the plurality of color-separated optical images and generating respective electrical image signals in synchronism with respective driving pulses,
   driving means for generating said respective driving pulses to be supplied to said solid state image pickup devices,
   first pulse means for generating respective first sampling pulses synchronized with said respective driving pulses, and
   a plurality of signal processing channels, having respective sampling means for generating respective sampled image signals by sampling the respective electrical image signals from the respective solid state image pickup devices by means of the respective first sampling pulses, having respective analog-to-digital converting means for converting the respective sampled image signals to respective digital image signals by means of respective second sampling pulses for analog-to-digital conversion, and having respective second pulse means for generating the respective second sampling pulses for analog-to-digital conversion,
   wherein a common phase control means for controlling a phase of the respective second sampling pulses for analog-to-digital conversion in relation to the phase of the respective first sampling pulses is provided commonly to the plurality of signal processing channels.

20. A solid state image pickup device, which is used in a solid state image pickup apparatus, comprising:
   an image part for receiving an image of an object and generating an image signal thereof representing the image of the object;
   a transfer part for outputting the image signal by transferring electric charges generated in the image part;
   a test signal generating means for generating a test signal alternately changing in level for each pixel synchronously with the image signal for adjusting the sampling timing of the image signal; and wherein the image part, the transfer part and the test signal generating means are integrally formed in a single semiconductor chip or in a package and are driven by means of a common driving pulse.

21. A solid state image pickup device as defined in claim 20, wherein the test signal generating means is provided adjacently to the image part.

22. A solid state image pickup device as defined in claim 20, wherein the test signal generating means is provided adjacently to the transfer part.

23. A solid state image pickup device as defined in claim 20, wherein the image part and the transfer part are provided in one semiconductor chip, the test signal generating means is formed in another semiconductor chip, and the first and second semiconductor chips are provided in one package.

24. A solid state image pickup apparatus as defined in claim 11, wherein the control means comprises:
a fine-adjustment delay circuit for compensating a delay time from a point in time when the second sampling pulse for analog-to-digital conversion has been supplied to the analog-to-digital converting means to the point in time when the analog-to-digital conversion is actually performed.

25. A solid state image pickup apparatus as defined in claim 12, wherein the control means comprises:
a fine-adjustment delay circuit for compensating a delay time from a point in time when the second sampling pulse for analog-to-digital conversion has been supplied to the analog-to-digital converting means to the point in time when the analog-to-digital conversion is actually performed.

26. A solid state image pickup apparatus as defined in claim 13, wherein the control means comprises:
a fine-adjustment delay circuit for compensating a delay time from a point in time when the second sampling pulse for analog-to-digital conversion has been supplied to the analog-to-digital converting means to the point in time when the analog-to-digital conversion is actually performed.

27. A solid state image pickup apparatus as defined in claim 14, wherein the control means comprises:
a fine-adjustment delay circuit for compensating a delay time from a point in time when the second sampling pulse for analog-to-digital conversion has been supplied to the analog-to-digital converting means to the point in time when the analog-to-digital conversion is actually performed.

* * * * *